(12) United States Patent
Ota

(10) Patent No.: US 10,134,435 B2
(45) Date of Patent: Nov. 20, 2018

(54) CARBON FILM FORMING APPARATUS, CARBON FILM FORMING METHOD, AND MAGNETIC RECORDING MEDIUM MANUFACTURING METHOD

(71) Applicant: SHOWA DENKO K.K., Tokyo (JP)

(72) Inventor: Ichiro Ota, Chiba (JP)

(73) Assignee: SHOWA DENKO K.K., Tokyo (JP)

( * ) Notice: Subject to any disclaimer, the term of this patent is extended or adjusted under 35 U.S.C. 154(b) by 437 days.

(21) Appl. No.: 14/575,385

(22) Filed: Dec. 18, 2014

(65) Prior Publication Data

US 2015/0187381 A1    Jul. 2, 2015

(30) Foreign Application Priority Data

Dec. 27, 2013 (JP) ................................. 2013-273426

(51) Int. Cl.
| | |
|---|---|
| *C23C 16/26* | (2006.01) |
| *G11B 5/84* | (2006.01) |
| *C23C 14/06* | (2006.01) |
| *C23C 14/22* | (2006.01) |
| *C23C 16/27* | (2006.01) |
| *H01J 37/32* | (2006.01) |

(52) U.S. Cl.
CPC ........ *G11B 5/8408* (2013.01); *C23C 14/0605* (2013.01); *C23C 14/221* (2013.01); *C23C 16/272* (2013.01); *H01J 37/32018* (2013.01); *H01J 37/3266* (2013.01)

(58) Field of Classification Search
CPC .......... H01J 37/32; C23C 14/06; C23C 16/26; C23C 16/44; D11B 5/5408
USPC ........... 427/550, 547, 122; 428/833.2, 833.3, 428/833.4, 835, 835.1, 835.2, 835.4; 118/621, 623, 723, 715
See application file for complete search history.

(56) References Cited

U.S. PATENT DOCUMENTS

| | | | | |
|---|---|---|---|---|
| 5,455,197 | A | * 10/1995 | Ghanbari | ............ C23C 14/0036 204/192.13 |
| 2004/0163951 | A1 | * 8/2004 | Iseki | ....................... C23C 14/35 204/298.2 |
| 2009/0314206 | A1 | * 12/2009 | Marunaka | ............. C23C 14/046 118/723 R |

FOREIGN PATENT DOCUMENTS

| | | |
|---|---|---|
| JP | 5-48299 B2 | 7/1993 |
| JP | 06-176888 * | 6/1994 |
| JP | 06-176888 A | 6/1994 |
| JP | 6-280008 A | 10/1994 |
| JP | 7-316793 A | 12/1995 |

(Continued)

OTHER PUBLICATIONS

Communication dated Apr. 25, 2017 from the Japanese Patent Office in counterpart application No. 2013-273426.

*Primary Examiner* — Tabassom Tadayyon Eslami
(74) *Attorney, Agent, or Firm* — Sughrue Mion, PLLC

(57) ABSTRACT

A carbon film forming method, that introduces a raw material gas including carbon into a film forming chamber, ionizes the gas by using an ion source, accelerates the ionized gas, and radiates the ionized gas to a surface of a substrate to form a carbon film on the surface of the substrate, includes forming the carbon film while rotating a first magnet, which is provided on the opposite side of the substrate across a region in which the raw material gas is ionized so as to be eccentric and/or inclined with respect to a central axis connecting the center of the ion source and a position corresponding to the center of the substrate held by the holder, in a circumferential direction.

6 Claims, 14 Drawing Sheets

(56) References Cited

FOREIGN PATENT DOCUMENTS

| | | | |
|---|---|---|---|
| JP | 2000-226659 | A | 8/2000 |
| JP | 2011-065714 | A | 3/2011 |
| JP | 2011-065714 | * | 3/2016 |

* cited by examiner

CARBON FILM FORMING APPARATUS, CARBON FILM FORMING METHOD, AND MAGNETIC RECORDING MEDIUM MANUFACTURING METHOD

BACKGROUND OF THE INVENTION

Field of the Invention

The present invention relates to a carbon film forming apparatus, a carbon film forming method, and a magnetic recording medium manufacturing method.

Priority is claimed on Japanese Patent Application No. 2013-273426, filed on Dec. 27, 2013, the content of which is incorporated herein by reference.

Description of Related Art

In recent years, in the field of magnetic recording media used in, for example, hard disk drives (HDDs), recording density has been remarkably improved and has been continuously increasing at a phenomenal rate of about 1.5 times a year. There are various techniques for improving the recording density. A technique which controls sliding characteristics between a magnetic head and a magnetic recording medium can be exemplified as one of the key technologies.

Protective films made of various materials have been proposed as the protective film of the magnetic recording medium. However, a carbon film has been mainly used, from the viewpoint of the overall performance, such as film formability and durability. In addition, for example, the hardness, density, dynamic friction coefficient, and compactness of the carbon film are very important since they are vividly reflected in the CSS (contact start-stop) characteristics or anticorrosion characteristics of the magnetic recording medium.

In order to improve the recording density of the magnetic recording medium, it is preferable to reduce the flying height of the magnetic head and to increase the number of rotations of the magnetic recording medium. Therefore, the protective film formed on the surface of the magnetic recording medium requires high sliding durability or flatness in order to cope with, for example, an accidental contact of the magnetic head. In addition, it is necessary to reduce the thickness of the protective film as much as possible, for example, to a thickness of 30 Å or less, in order to reduce the spacing loss between the magnetic recording medium and the magnetic head and to improve the recording density. There is a strong demand for a protective film which is smooth, thin, dense, and strong.

In addition, the carbon film used as the protective film of the magnetic recording medium is formed by, for example, a sputtering method, a CVD method, or an ion beam deposition method. Among these methods, when the carbon film is formed with a thickness of, for example, 100 Å or less by the sputtering method, the durability of the carbon film is insufficient. On the other hand, when the carbon film formed by the CVD method has low surface smoothness and a small thickness, the coverage of the surface of the magnetic recording medium is reduced, which may cause corrosion of the magnetic recording medium. In contrast, the ion beam deposition method is capable of forming a carbon film with high hardness, smoothness, and density, as compared to the sputtering method or the CVD method.

As a method of forming a carbon film using the ion beam deposition method, for example, a method has been proposed in which a deposition raw material gas is changed to plasma by discharge between a heated filament-shaped cathode and an anode in a film forming (deposition) chamber in a vacuum atmosphere and the resultant is then accelerated and collides with the surface of a substrate having a negative potential, thereby stably forming a carbon film with high hardness (see Japanese Unexamined Patent Application, First Publication No. 2000-226659).

A method has been proposed in which a magnet is provided around a carbon ion source and is rotated in a circumferential direction to form a carbon film with a uniform thickness and high hardness and density (see Japanese Unexamined Patent Application, First Publication No. 2011-65714).

In addition, a structure has been known in which magnets are provided around an ion source and on the rear side of the ion source (see Japanese Unexamined Patent Application, First Publication No. H6-176888). In the structure disclosed in Japanese Unexamined Patent Application, First Publication No. H6-176888, the magnet is not rotatable, but is fixed.

However, it is necessary to further reduce the thickness of the carbon film in order to further improve the recording density of the magnetic recording medium. It is necessary to manage the thickness of the carbon film on the basis of the thinnest portion of the carbon film formed on the surface of the magnetic recording medium in order to ensure the abrasion resistance or anticorrosion performance of the magnetic recording medium. Therefore, when the thickness distribution of the carbon film formed on the surface of the magnetic recording medium is not constant in the plane, it is difficult to reduce the thickness of the carbon film. In particular, in the method disclosed in Japanese Unexamined Patent Application, First Publication No. 2000-226659, since the filament, which is a carbon gas excitation source, has a shape that extends in one direction, the carbon film deposited on the surface of the substrate has a thickness distribution which depends on the shape of the filament.

In the method disclosed in Japanese Unexamined Patent Application, First Publication No. 2011-65714, the carbon film with high hardness and density can be formed with a uniform thickness over the wide range of the region on the surface (major surface) of the substrate. However, there is a large variation in thickness in the vicinity of the inner circumference and outer circumference of the substrate.

SUMMARY OF THE INVENTION

The invention has been made in view of the above mentioned problems and an object of the invention is to provide a carbon film forming method which can form a carbon film that has high hardness and density and has a uniform thickness over the wide range of the region on the surface (major surface) of a substrate.

Another object of the invention is to provide a carbon film forming apparatus which can form a carbon film that has high hardness and density and has a uniform thickness over the wide range of the region on the surface (major surface) of a substrate.

Still another object of the invention is to provide a magnetic recording medium manufacturing method which uses, as a protective layer of a magnetic recording medium, a carbon film that has high hardness and density and has a uniform thickness over the wide range of the region on the surface (major surface) of a substrate to obtain a magnetic recording medium with high abrasion resistance and corrosion resistance.

In order to achieve the above mentioned objects, the invention has the following structures.

(1) According to an aspect of the present invention, a carbon film forming method, that introduces a raw material gas including carbon into a film forming chamber, ionizes the gas by using an ion source, accelerates the ionized gas, and radiates the ionized gas to a surface of a substrate to form a carbon film on the surface of the substrate, includes: forming the carbon film while rotating a first magnet, which is provided on the opposite side of the substrate across a region in which the raw material gas is ionized so as to be eccentric and/or inclined with respect to a central axis connecting the center of the ion source and a position corresponding to the center of the substrate held by the holder, in a circumferential direction.

(2) In the aspect stated in the above (1), a second magnet, which is provided around a region in which the ionized gas is accelerated so as to be eccentric and/or inclined with respect to a central axis connecting the center of the ion source and a position corresponding to the center of the substrate held by the holder, may be rotating while forming the carbon film.

(3) According to an aspect of the present invention, a magnetic recording medium manufacturing method includes using the carbon film forming method according to the aspect stated in the above (1).

(4) According to an aspect of the present invention, a magnetic recording medium manufacturing method includes using the carbon film forming method according to the aspect stated in the above (2).

(5) According to an aspect of the present invention, a carbon film forming apparatus includes a film forming chamber; a holder that can hold a substrate in the film forming chamber; an introduction pipe that introduces a raw material gas including carbon into the film forming chamber; an ion source that radiates an ion beam to the substrate held by the holder; and a first magnet that is provided on the opposite side of the substrate across the ion source on a central axis, which connects the center of the ion source and a position corresponding to the center of the substrate held by the holder, outside the film forming chamber and can be rotated about the central axis, wherein the first magnet is eccentric and/or inclined with respect to the central axis.

(6) In the aspect stated in the above (5), a second magnet may be provided in the outer circumference of the side wall of the film forming chamber and can be rotated about a central axis which connects the center of the ion source and a position corresponding to the center of the substrate held by the holder, wherein the second magnet is eccentric and/or inclined with respect to the central axis.

According to the invention, it is possible to provide a carbon film forming apparatus which can form a carbon film that has high hardness and density and has a uniform thickness over the wide range of the region on the surface (major surface) of a substrate.

According to the invention, it is possible to provide a carbon film forming method which can form a carbon film that has high hardness and density and has a uniform thickness over the wide range of the region on the surface (major surface) of a substrate.

According to the invention, it is possible to provide a magnetic recording medium manufacturing method which uses, as a protective layer of a magnetic recording medium, a carbon film that has high hardness and density and has a uniform thickness over the wide range of the region on the surface (major surface) of a substrate to obtain a magnetic recording medium with high abrasion resistance and corrosion resistance.

DETAILED DESCRIPTION OF THE INVENTION

Figure 1:
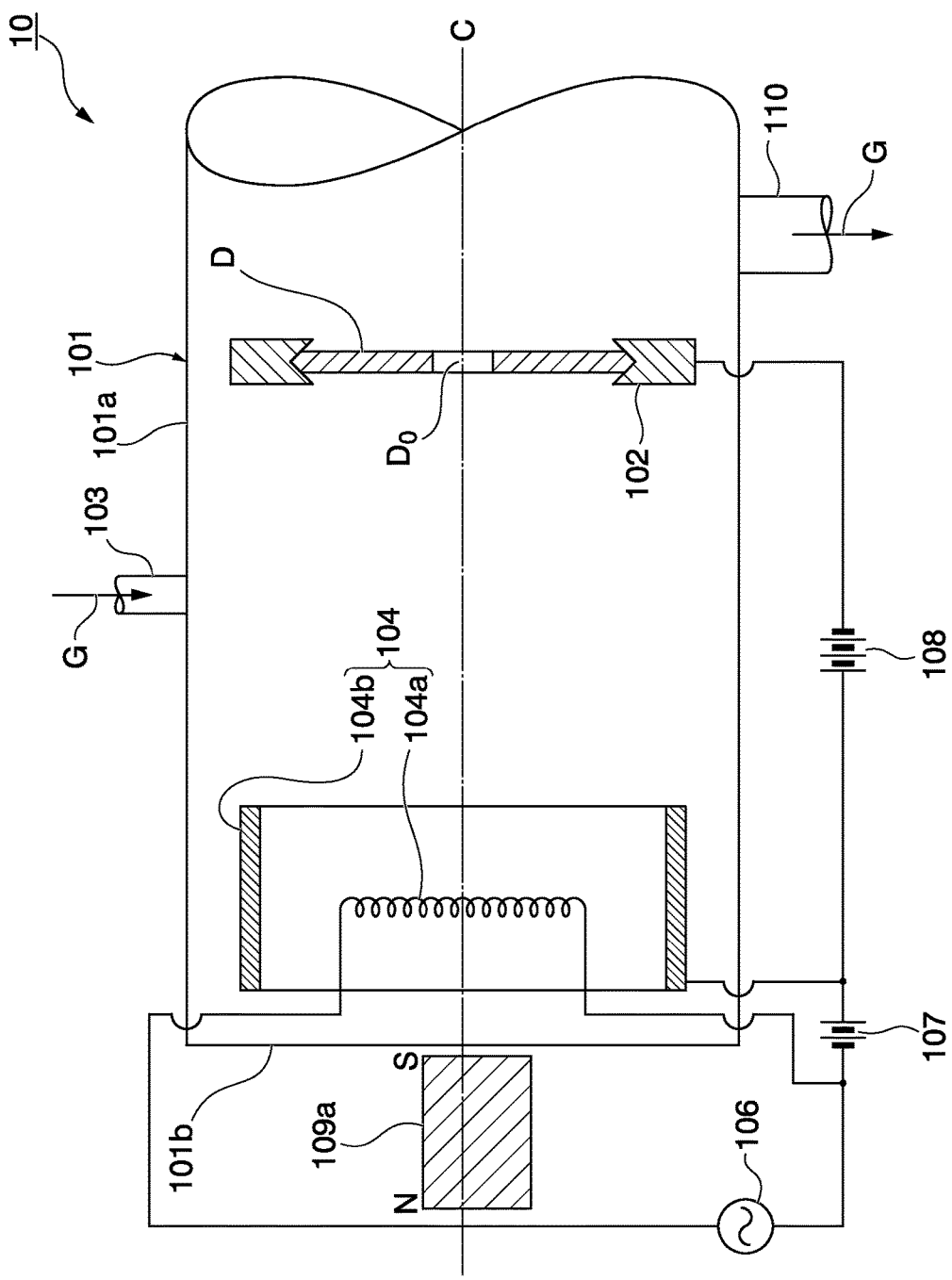
FIG. 1 is a diagram schematically showing the structure of a carbon film forming apparatus according to a first embodiment of the invention.

Hereinafter, embodiments of the invention will be described in detail with reference to the drawings. In the drawings used in the following description, in some cases, a characteristic portion is enlarged for convenience and ease of understanding and the dimensions and ratio of each component may not be the same as the actual dimensions and ratio. In addition, for example, materials and dimensions which are exemplified in the following description are illustrative examples and the invention is not limited thereto. Various modifications and changes can be made, without departing from the scope and spirit of the invention.

[Carbon Film Forming Apparatus]

(First Embodiment)

First, a carbon film forming apparatus according to the invention will be described.

FIG. 1 is a diagram schematically showing the structure of a carbon film forming apparatus according to a first embodiment of the invention.

A carbon film forming apparatus 10 shown in FIG. 1 is a film forming apparatus using an ion beam deposition method and has a schematic structure including a film forming (deposition) chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, and a first magnet 109a that is provided on the opposite side of substrate across the ion source 104 on a central axis C, which connects the center of the ion source 104 and a position $D_0$ corresponding to the center of the substrate D held by the holder 102, outside the film forming chamber 101, can be rotated about the central axis C. The first magnet 109a is eccentric with respect to the central axis C, that is, not centered on the central axis. Thus the center of the first magnet 109a is not on the central axis.

The extension direction of the central axis C is aligned with an ion beam radiation direction (the traveling direction of a central portion of the ion beam). When the ion source is symmetric with respect to the central axis of the film forming chamber, the central axis C is aligned with the central axis of the film forming chamber.

In addition, the carbon film forming apparatus shown in FIG. 1 includes a first power supply 106 that supplies power to a cathode electrode 104a, a second power supply 107 that generates a discharge between the cathode electrode 104a and an anode electrode 104b, and a third power supply 108 that provides a potential difference between the cathode electrode 104a or the anode electrode 104b and the substrate D.

The ion source 104 shown in FIG. 1 includes the filament-shaped cathode electrode 104a and the anode electrode 104b which is provided around the cathode electrode 104a.

FIG. 1 shows a state in which the substrate D is held by the holder 102. It is preferable that the side wall of the film forming chamber 101 have a cylindrical shape. However, the shape of the side wall is not limited to a cylindrical shape.

The film forming chamber 101 is airtightly formed by a chamber wall 101a and can be depressurized through an exhaust pipe 110 which is connected to a vacuum pump (not shown).

The first power supply 106 is an AC power supply which is connected to the cathode electrode 104a and supplies power to the cathode electrode 104a when a carbon film is formed. In addition, the first power supply 106 is not limited to the AC power supply, and may be a DC power supply.

The second power supply 107 is a DC power supply that has a negative electrode connected to the cathode electrode 104a and a positive electrode connected to the anode electrode 104b and generates a discharge between the cathode electrode 104a and the anode electrode 104b when the carbon film is formed.

The third power supply 108 is a DC power supply that has a positive electrode connected to the anode electrode 104b and a negative electrode connected to the holder 102 and provides a potential difference between the anode electrode 104b and the substrate D held by the holder 102 when the carbon film is formed. In addition, the third power supply 108 may be configured such that the positive electrode is connected to the cathode electrode 104a.

The first magnet 109a is a permanent magnet or an electromagnet. The first magnet 109a has a shape that is symmetric with respect to an axis parallel to the central axis C and can form the magnetic field in a direction parallel to the central axis C. Examples of the structure that is symmetric with respect to the direction parallel to the central axis C include a magnet having a cylindrical block shape (which is rotationally symmetric with respect to the axis parallel to the central axis C) and a magnet having a rectangular parallelepiped block shape with a square section (which has a fourfold symmetry with respect to the axis parallel to the central axis C). The first magnet 109a is arranged on the backside (rear side) of the ion source 104, that is, on the side of the ion source 104 opposite to the substrate D (the side which does not face the substrate D) on the central axis C in the vicinity of a first end portion 101b of the film forming chamber 101, so as to be eccentric with respect to the central axis C (when the first magnet is symmetric with respect to the direction parallel to the central axis C, the central axis (the axis of rotational symmetry) of the first magnet deviates from the central axis C in parallel). In the eccentric state, the first magnet 109a can be rotated about the central axis C by a driving motor (not shown). When the permanent magnet is used as the first magnet 109a, it is preferable to use a sintered magnet which can generate a strong magnetic field.

For example, in the case of an apparatus for forming a carbon film having the shown in the following examples, it is preferable that an eccentric distance from the central axis C to an eccentric axis be in the range of 2 mm to 20 mm. When the eccentric distance is less than 2 mm, the technical effect obtained by the eccentricity of the first magnet is insufficient. When the eccentric distance is greater than 20 mm, there is a concern that plasma will be unstable in an ion region and the quality of the formed carbon film will deteriorate. In addition, it is difficult to rotate the magnet at high speed.

It is preferable that the number of rotations of the first magnet 109a be set in the range of, for example, 50 rpm to 2000 rpm.

In the invention, the rotation of the first magnet 109a includes the continuous rotation of the first magnet 109a in one direction over an angle of 360° and the reciprocating rotation (swinging) of the first magnet 109a at an angle of less than 360°. For example, it is possible to uniformize the magnetic field generated in the film forming chamber 101 when a plurality of bar magnets, as the first magnet 109a, are provided in parallel at equal intervals with respect to the central axis of rotation (rotation axis), an angle between two lines connecting the central axis and the positions of two adjacent bar magnets is X°, and the angle range of the reciprocating rotation (swinging) of the bar magnets is X°. In addition, when the electromagnet is used as the first magnet 109a, it is preferable to reciprocatively rotate the electromagnet in an angle range of 180° to less than 360° since it is necessary to supply power to the electromagnet.

In the invention, when a carbon film is formed on a disk-shaped substrate with an outside diameter of 3.5 inches, the voltage and current which are generated by each power supply are set as described below. The voltage and current to be generated depend on the size of the substrate D. For the first power supply 106, it is preferable that the voltage be set in the range of 10 V to 100 V and a DC current or an AC current be set in the range of 5 A to 50 A. For the second power supply 107, it is preferable that the voltage be set in the range of 50 V to 300 V and the current be set in the range of 10 mA to 5000 mA. For the third power supply 108, it is preferable that the voltage be set in the range of 30 V to 500 V and the current be set in the range of 10 mA to 200 mA.

When the carbon film forming apparatus having the above mentioned structure is used to form a carbon film on the surface of the substrate D, the raw material gas G including carbon is introduced into the film forming chamber 101, which is depressurized through the exhaust pipe 110, through the introduction pipe 103. The raw material gas G is excited and decomposed by thermal plasma which is generated by the heating of the cathode electrode 104a with the supply of power from the first power supply 106 and plasma which is generated by the discharge between the cathode electrode 104a and the anode electrode 104b with the supply of power from the second power supply 107 and becomes an ionized gas (carbon ion). Then, the carbon ions excited in the plasma collide with the surface of the substrate D while being accelerated to the substrate D with a negative potential by the third power supply 108.

In the carbon film forming apparatus according to this embodiment, it is possible to apply the magnetic field in a region (hereinafter, referred to as an excitation space) in which the raw material gas G is ionized or the ionized gas is accelerated, using the first magnet 109a which is provided in the vicinity of one end portion 101b of the chamber.

In the carbon film forming apparatus according to this embodiment, when the carbon ions are accelerated and radiated to the surface of the substrate D, the magnetic field generated by the first magnet 109 can be applied from the outside to increase the ion density of the ion beams which are accelerated and radiated to the surface of the substrate D. In this case, when the ion density increases in the excitation space, an excitation force in the excitation space is strengthened and carbon ions with a higher energy level can be accelerated and radiated to the surface of the substrate D. As a result, it is possible to form a carbon film with high hardness and density on the surface of the substrate D.

Figure 5:
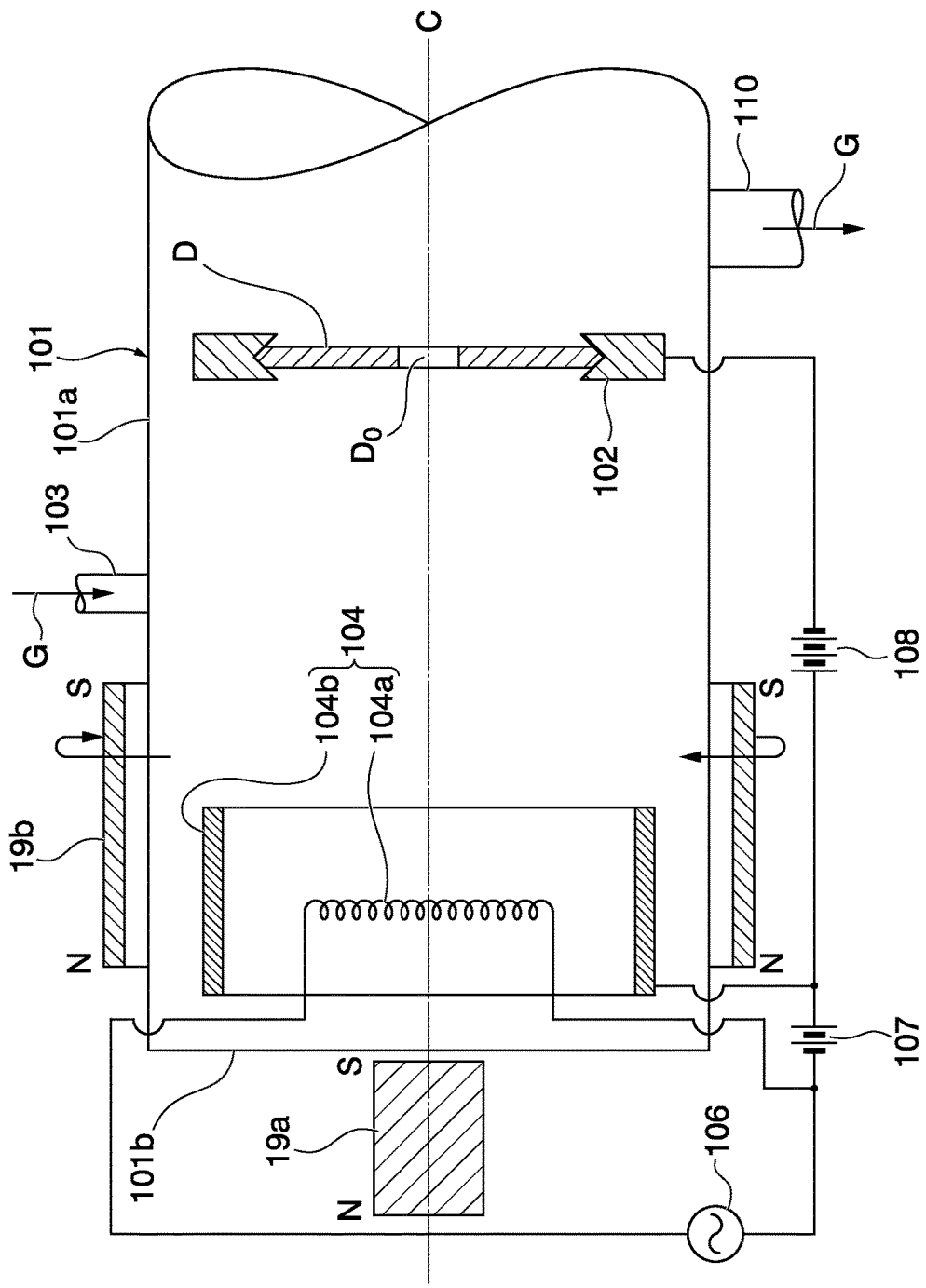
FIG. 5 is a diagram schematically showing the structure of a carbon film forming apparatus in which a magnet is not eccentric or inclined with respect to a central axis.

In the carbon film forming apparatus according to this embodiment, the first magnet 109a which is provided on the rear side of the excitation space (on the opposite side of the substrate across the ion source) so as to be eccentric with respect to the central axis C is rotated about the central axis C. According to this structure, it is possible to manufacture a substrate which has a uniform incident amount distribution of the carbon ions in the diametric direction of the surface of the substrate D and has a uniform thickness distribution of the carbon film on the inner circumferential side and the outer circumferential side of the surface of the substrate D, as compared to a structure in which magnets 19a and 19b are provided around the excitation space so as not to be eccentric with respect to the central axis C and are rotated about the central axis C (see FIG. 5).

The carbon film forming apparatus according to this embodiment has an advantage in that only one type of magnet is used to adjust the magnetic field applied to the excitation space and it is easy to adjust the magnetic field. In addition, the carbon film forming apparatus according to this embodiment has the following advantages. Since the size of the first magnet 109a is smaller than that of a second magnet 109b which will be described below, the first magnet 109a is easier to rotate than the second magnet 109b and can be rotated at high speed, and it is easy to form a rotating mechanism of the apparatus. In addition, since the first magnet 109a can be rotated at high speed, it is easy to adjust the thickness of a film.

In the carbon film forming apparatus shown in FIG. 1, the carbon film is formed on only one surface of the substrate D. However, the carbon film may be formed on both surfaces of the substrate D. In this case, the same apparatus structure as that when the carbon film is formed on only one surface of the substrate D may be provided on both sides of the substrate D in the film forming chamber 101.

(Second Embodiment)

Figure 2:
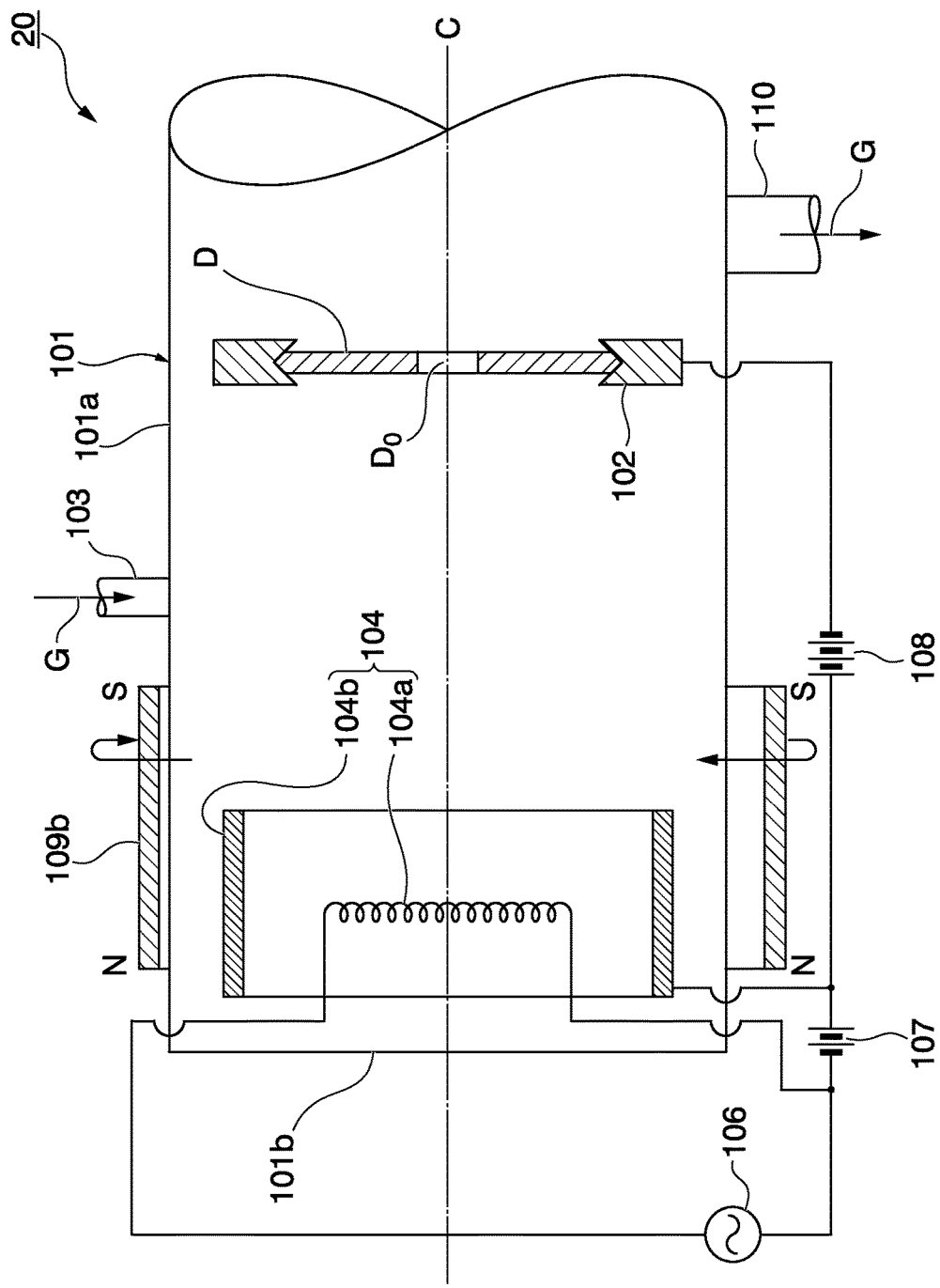
FIG. 2 is a diagram schematically showing the structure of a carbon film forming apparatus according to a second embodiment of the invention.

FIG. 2 is a diagram schematically showing the structure of a carbon film forming apparatus according to a second embodiment of the invention.

The carbon film forming apparatus according to this embodiment differs from the carbon film forming apparatus according to the first embodiment, in which the magnet is provided on the rear side of the ion source 104 on the central axis C outside the film forming chamber, in that a magnet (second magnet 109b) is provided in the outer circumference of a side wall 101a of a film forming chamber 101.

The carbon film forming apparatus 20 shown in FIG. 2 is a film forming apparatus using an ion beam deposition method and has a schematic structure including a film forming chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, and the second magnet 109b that is provided in the outer circumference of the side wall 101a of the film forming chamber 101, can be rotated about a central axis C connecting the center of the ion source 104 and a position $D_0$ corresponding to the center of the substrate held by the holder 102, and is eccentric with respect to the central axis C, that is, not centered on the central axis.

When the side wall 101a of the film forming chamber 101 has a cylindrical shape, it is preferable that the second magnet also have a cylindrical shape. However, a plurality of magnets having a rectangular parallelepiped shape may be arranged so as to surround the side wall of the film forming chamber.

In the invention, the rotation of the second magnet 109b includes the continuous rotation of the second magnet 109b in one direction over an angle of 360° and the reciprocating rotation (swinging) of the second magnet 109b at an angle of less than 360°. For example, it is possible to uniformize the magnetic field generated in the film forming chamber 101 when a plurality of bar magnets, as the second magnet 109b, are provided in parallel at equal intervals with respect to the central axis of rotation, an angle between two lines connecting the central axis and the positions of two adjacent bar magnets is X°, and the angle range of the reciprocating rotation (swinging) of the bar magnets is X°. In addition, when an electromagnet is used as the second magnet 109b, it is preferable to reciprocatively rotate the electromagnet in an angle range of equal to or greater than 180° and less than 360° since it is necessary to supply power to the electromagnet.

The second magnet 109b is a permanent magnet or an electromagnet. The second magnet is not limited to a single magnet, but may be configured by arranging a plurality of magnets. The second magnet 109b is provided in the outer circumference of the chamber wall (side wall) 101a of the film forming chamber 101 so as to be eccentric with respect to the central axis C (the central axis of the second magnet deviates from the central axis C in parallel). In the eccentric state, the second magnet 109b can be rotated by a driving motor (not shown) about the central axis C that connects the center of the ion source 104 and the position corresponding to the center of the substrate D held by the holder 102.

When the permanent magnet is used as the second magnet 109b, it is preferable to use a sintered magnet which can generate a strong magnetic field.

For example, in the case of an apparatus for forming a carbon film having the size shown in the following examples, it is preferable that an eccentric distance from the central axis C to an eccentric axis be in the range of 3 mm to 50 mm. When the eccentric distance is less than 3 mm, the technical effect obtained by the eccentricity of the second magnet is insufficient. When the eccentric distance is greater than 50 mm, there is a concern that plasma will be unstable in an ion acceleration region and the quality of the formed carbon film will deteriorate. In addition, it is difficult to rotate the magnet at high speed.

It is preferable that the number of rotations of the second magnet 109b be set in the range of, for example, 20 rpm to 200 rpm.

In the invention, when a carbon film is formed on a disk-shaped substrate with an outside diameter of 3.5 inches, the voltage and current which are generated by each power supply are set as described below. The voltage and current to be generated depend on the size of the substrate D. For a first power supply 106, it is preferable that the voltage be set in the range of 10 V to 100 V and a DC current or an AC current be set in the range of 5 A to 50 A. For a second power supply 107, it is preferable that the voltage be set in the range of 50 V to 300 V and the current be set in the range of 10 mA to 5000 mA. For a third power supply 108, it is preferable that the voltage be set in the range of 30 V to 500 V and the current be set in the range of 10 mA to 200 mA.

In the carbon film forming apparatus according to this embodiment, it is possible to apply the magnetic field in a region (hereinafter, referred to as an excitation space) in which the raw material gas G is ionized or the ionized gas is accelerated, using the second magnet 109b provided around the chamber wall 101a.

In the carbon film forming apparatus according to this embodiment, when the carbon ions are accelerated and radiated to the surface of the substrate D, the magnetic field generated by the second magnet 109b can be applied from the outside to increase the ion density of the ion beams which are accelerated and radiated to the surface of the substrate D. In this case, when the ion density in the excitation space increases, an excitation force in the excitation space is strengthened and carbon ions with a higher energy level can be accelerated and radiated to the surface of the substrate D. As a result, it is possible to form a carbon film with high hardness and density on the surface of the substrate D.

In the carbon film forming apparatus according to this embodiment, the second magnet 109b which is provided around the excitation space so as to be eccentric with respect to the central axis C is rotated about the central axis C. According to this structure, it is possible to manufacture a substrate which has a uniform incident amount distribution of the carbon ions in the diametric direction of the surface of the substrate D and has a uniform thickness distribution of the carbon film on the inner circumferential side and the outer circumferential side of the surface of the substrate D, as compared to the structure in which magnets 19a and 19b are provided around the excitation space so as not to be eccentric with respect to the central axis C and are rotated about the central axis C (see FIG. 5).

In this embodiment, the second magnet 109b which is provided around the cathode electrode 104a and the anode electrode 104b can apply the magnetic field to the excitation space in the film forming chamber 101. For example, the magnetic field represented by the magnetic field lines shown in FIGS. 3A, 3B and 3C can be used as the magnetic field applied by the second magnet 109b.

Figure 3A:
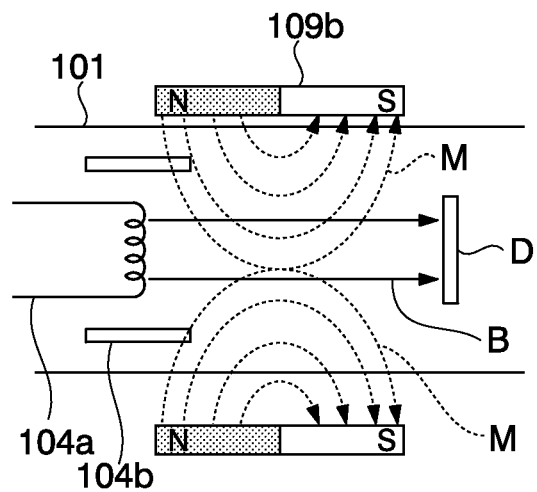
FIGS. 3A, 3B and 3C are schematic diagrams showing the magnetic field applied by a magnet and the direction of magnetic field lines.

That is, in the structure shown in FIG. 3A (the same structure as that shown in FIG. 2), the second magnet 109b is arranged around the chamber wall 101a of the film forming chamber 101 such that it is eccentric with respect to the central axis C, the S-pole is close to the substrate D, and the N-pole is close to the cathode electrode 104a. In this structure, the direction of magnetic field lines M which are generated by the second magnet 109b are substantially parallel to the acceleration direction of an ion beam B in the vicinity of the eccentric axis of the second magnet which deviates from the central axis of the film forming chamber 101 (the eccentric axis of the second magnet corresponds to the central axis of the second magnet). The carbon ion receives the Lorentz force from the magnetic field under the magnetic field formed by the second magnet 109b.

In particular, the carbon ion which is radiated in a direction deviating from the direction of the eccentric axis receives the Lorentz force which is generated by the motion of a velocity component perpendicular to the direction connecting the ion source and the substrate among the velocity components of the carbon ion and makes a circular motion about the eccentric axis. Therefore, a carbon ion group is concentrated in the vicinity of the eccentric axis and is moved to the substrate D while being spread around the eccentric axis according to the magnitude of the Lorentz force applied to the carbon ion. In addition, when the second magnet 109b is rotated with the magnetic field lines M being set in the above mentioned direction in the film forming chamber 101, the eccentric axis makes a circular motion while being parallel to the central axis C. Since the carbon ions are distributed so as to be concentrated on the eccentric axis which makes a circular motion, the spreading of the carbon ion group is increased by a value corresponding to the eccentricity of the second magnet 109b. Since the carbon ions are radiated to the surface of the substrate in a distribution corresponding to the spreading of the carbon ion group, it is possible to accelerate the uniformization of the density distribution of the carbon ion beams in the diametric direction of the substrate, as compared to a structure in which the second magnet 109b is not rotated. The magnitude of the magnetic field generated by the second magnet 109b can be adjusted to adjust the degree of spreading of the carbon ion group. That is, it is possible adjust magnitude of the magnetic field generated by the second magnet 109b to increase the uniformity of the density distribution of the carbon ion beams in the diametric direction of the substrate.

Figure 3B:
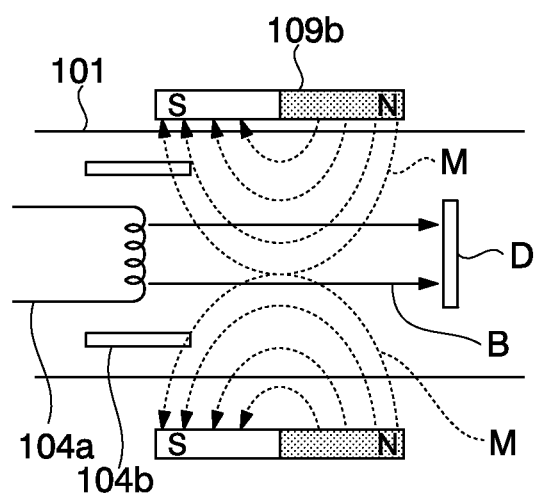
Figure 3C:
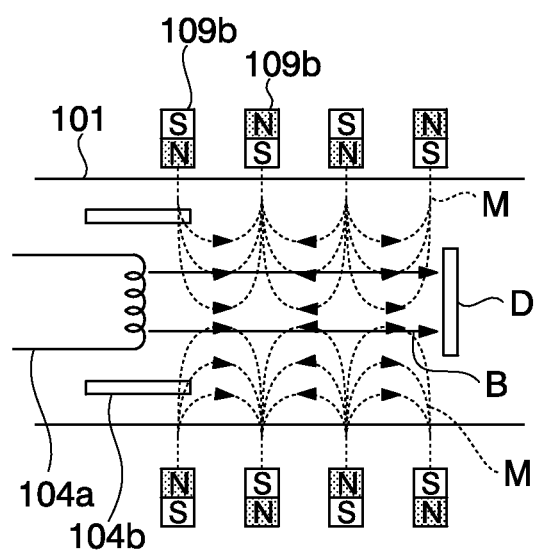

In the structure shown in FIG. 3B, the second magnet 109b is arranged around the chamber wall 101a of the film forming chamber 101 such that the S-pole is close to the cathode electrode 104a and the N-pole is close to the substrate D. In the structure shown in FIG. 3C, a plurality of second magnets 109b are arranged around the chamber wall 101a of the film forming chamber 101 such that the directions of the N-pole and the S-pole are alternately changed on the inner circumferential side and the outer circumferential side in the acceleration direction of the ion beam, that is, such that the magnetic poles facing the chamber wall 101a are alternately changed. In all of the structures, the magnetic field lines M generated by the second magnet 109b are substantially parallel to the acceleration direction of the ion beam B in the vicinity of the eccentric center and the carbon ion receives the Lorentz force formed by the magnetic field which are represented by the magnetic field lines M. As such, when the second magnet 109b is rotated, with the direction of the magnetic field lines M being set to the same direction as that in the structure shown in FIG. 3A, such that the eccentric axis of the second magnet 109b makes a circular motion, the carbon ions are distributed so as to be concentrated around the eccentric axis which makes a circular motion. As a result, the uniformization of the density distribution of the ion beams in the diametric direction of the substrate is accelerated.

In this embodiment, a sintered magnet is preferably used as the second magnet 109b in order to generate a strong magnetic field. However, it is difficult to manufacture one large sintered magnet. Therefore, in practice, a plurality of small sintered magnets are arranged in parallel, instead of using a large sintered magnet. In this case, the magnetic field which is generated by the plurality of second magnets 109b arranged around the chamber wall 101a is not necessarily constant (symmetric) in the excitation space. Therefore, in the invention, the plurality of second magnets 109b arranged around the chamber wall 101a are rotated in the circumferential direction of the chamber wall 101a to uniformize the magnetic field distribution in the excitation space.

When an electromagnet is used as the second magnet 109b, the distribution of the magnetic field generated varies depending on a method of winding coils on a magnetic core. Therefore, the second magnet 109b which is an electromagnet can be rotated in the circumferential direction to uniformize the magnetic field distribution in the excitation space.

In the carbon film forming apparatus according to this embodiment, only one type of magnet is used to adjust the application of the magnetic field to the excitation space for uniformizing the thickness distribution of the carbon film. Therefore, it is easy to adjust the magnetic field.

(Third Embodiment)

Figure 4:
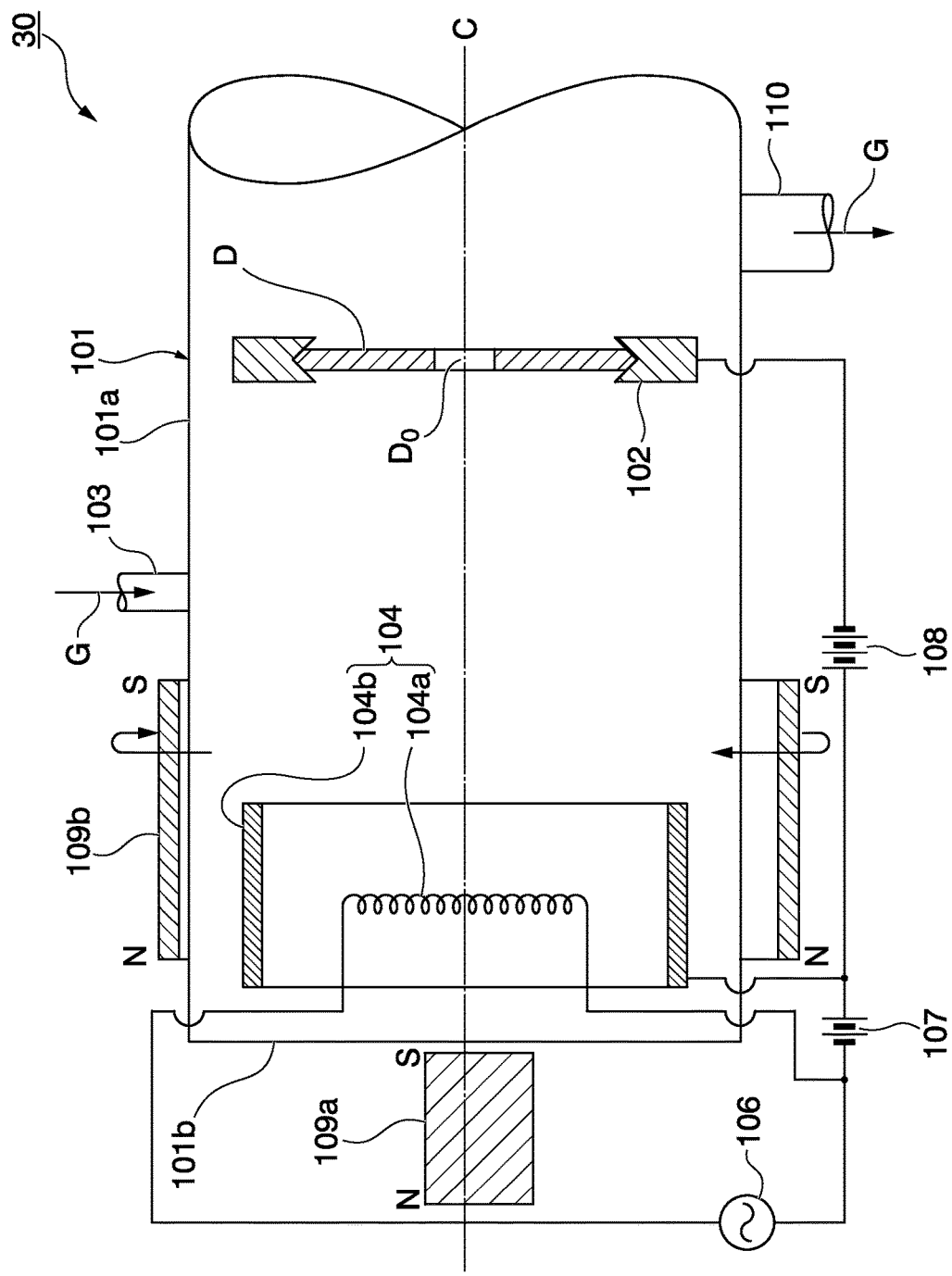
FIG. 4 is a diagram schematically showing the structure of a carbon film forming apparatus according to a third embodiment of the invention.

FIG. 4 is a diagram schematically showing the structure of a carbon film forming apparatus according to a third embodiment of the invention. The carbon film forming apparatus according to this embodiment differs from the carbon film forming apparatuses according to the first and second embodiments in that it includes both the first magnet 109a and the second magnet 109b.

A carbon film forming apparatus 30 shown in FIG. 4 is a film forming apparatus using an ion beam deposition method and has a schematic structure including a film forming chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, a first magnet 109a that is provided on the rear side of the ion source 104 on a central axis C, which connects the center of the ion source 104 and a position $D_0$ corresponding to the center of the substrate D held by the holder 102, outside the film forming chamber 101, can be rotated about the central axis C, and a second magnet 109b that is provided in the outer circumference of the side wall 101a of the film forming chamber 101, can be rotated about the central axis C. A first magnet 109a and a second magnet 109b are respectively eccentric with respect to the central axis C, that is, not centered on the central axis.

The carbon film forming apparatus according to this embodiment includes the first magnet 109a that is provided on the backside (rear side) of the ion source 104 so as to be eccentric with respect to the central axis C and the second magnet 109b that is provided in the outer circumference of the side wall 101a of the film forming chamber 101 so as to be eccentric with respect to the central axis C. Therefore, it is possible to strengthen the magnetic field which is generated in parallel to the central axis C, as compared to a structure in which only one of the first magnet 109a and the second magnet 109b is provided. As a result, it is possible to further accelerate the uniformization of the density distribution of ion beams in the diametric direction of the substrate. When the eccentric axis of the first magnet 109a (the eccentric axis of the first magnet 109a corresponds to the central axis of the first magnet 109a) is aligned with the eccentric axis of the second magnet 109b, the maximum magnetic field is formed on the eccentric axis.

It is preferable that the first magnet 109a and the second magnet 109b be eccentric with respect to the central axis C at the same angular position in the circumferential direction, as viewed from the direction of the central axis C. In the state in which the first magnet 109a and the second magnet 109b are eccentric with respect to the central axis C at the same angular position in the circumferential direction, when the two magnets are rotated at the same speed, the magnetic field distribution is rotated while being maintained.

In addition, only one of the first magnet 109a and the second magnet 109b may be rotated. The second magnet 109b may not be rotated and only the first magnet 109a may be rotated. In this case, since the size of the first magnet 109a is smaller than that of the second magnet 109b, the first magnet 109a is easier to rotate than the second magnet 109b and can be rotated at high speed, and it is easy to form a rotating mechanism of the apparatus. In addition, since the first magnet 109a can be rotated at high speed, it is easy to adjust the thickness of a film.

In addition, the carbon film forming apparatus according to this embodiment has the advantages over the carbon film forming apparatuses according to the first and second embodiments that it is possible to individually adjust the degree of eccentricity or magnetic force of two types of magnets, that is, the first magnet 109a and the second magnet 109b in order to uniformize the thickness distribution of the carbon film, and flexibility in adjustment is improved.

(Fourth Embodiment)

Figure 6:
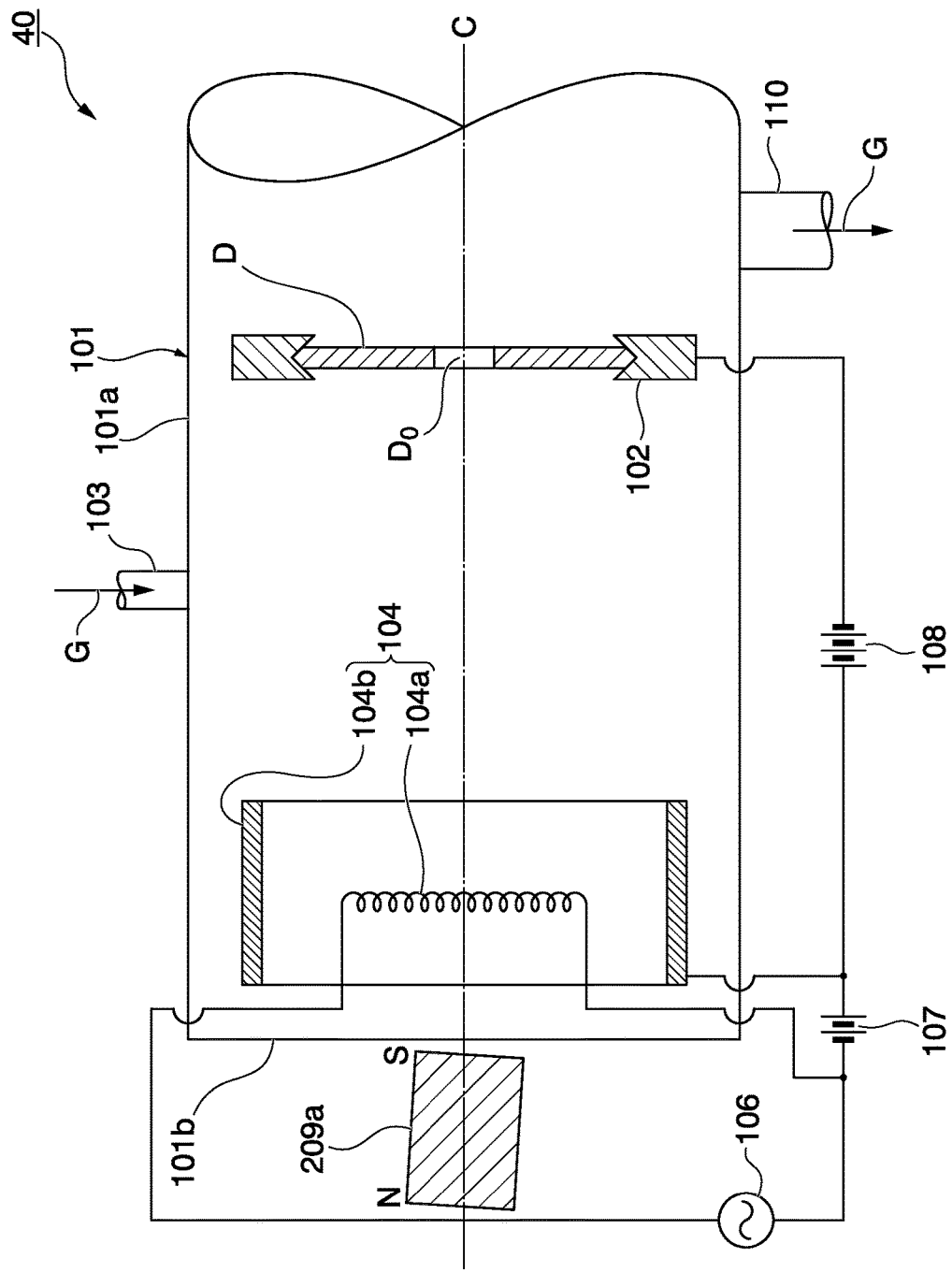
FIG. 6 is a diagram schematically showing the structure of a carbon film forming apparatus according to a fourth embodiment of the invention.

FIG. 6 is a diagram schematically showing the structure of a film forming apparatus according to a fourth embodiment of the invention.

As shown in FIG. 6, the carbon film forming apparatus according to the fourth embodiment differs from the carbon film forming apparatus according to the first embodiment in that a first magnet 209a is provided on the central axis C so as to be inclined with respect to the central axis C.

The term 'inclination' means that a segment connecting the N-pole and the S-pole of the first magnet 209a is not parallel to the central axis C.

The carbon film forming apparatus 40 shown in FIG. 6 is a film forming apparatus using an ion beam deposition method and has a schematic structure including a film forming chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, and the first magnet 209a that is provided on the rear side of the ion source 104 on the central axis C, which connects the center of the ion source 104 and a position $D_0$ corresponding to the center of the substrate D held by the holder 102, outside the film forming chamber 101, can be rotated about the central axis C, and is inclined with respect to the central axis C.

It is preferable that the inclination angle of the first magnet 209a be in the range of 3° to 30°. The reason is as follows. When the inclination angle is less than 3°, the technical effect obtained by the inclination of the magnet is insufficient. When the inclination angle is greater than 30°, there is a concern that plasma will be unstable in the region in which the magnetic field is applied and the quality of the formed carbon film will deteriorate. In addition, it is difficult to rotate the magnet at high speed.

Since the first magnet 209a is inclined with respect to the central axis C, the direction of the magnetic field (the direction of magnetic field lines) which is formed by the first magnet 209a along the central axis of the first magnet 209a is aligned with the direction which is inclined with respect to the central axis C and is not aligned with the radiation direction of ion beams, in the stationary state of the first magnet 209a (before the first magnet 209a is rotated). Therefore, when ion beams are radiated with the first magnet 209a in the stationary state, the incident amount distribution of carbon ions in the diametric direction of the surface of the substrate D is not uniform. However, when the first magnet 209a is rotated about the central axis C, it is possible to uniformize the incident amount distribution of the carbon ions in the diametric direction of the surface of the substrate D during the whole time when the carbon film is formed. Therefore, it is possible to further uniformize the thickness distribution of the carbon film on the substrate D.

The carbon film forming apparatus according to this embodiment has an advantage that, since only one type of magnet is adjusted, it is easy to adjust the magnet. In addition, the carbon film forming apparatus according to this embodiment has the following advantages. Since the size of the first magnet 209a is smaller than that of a second magnet 109b which will be described below, the first magnet 209a is easier to rotate than the second magnet 209b and can be rotated at high speed, and it is easy to form a rotating mechanism of the apparatus. In addition, since the first magnet 209a can be rotated at high speed, it is easy to adjust the thickness of a film.

(Fifth Embodiment)

Figure 7:
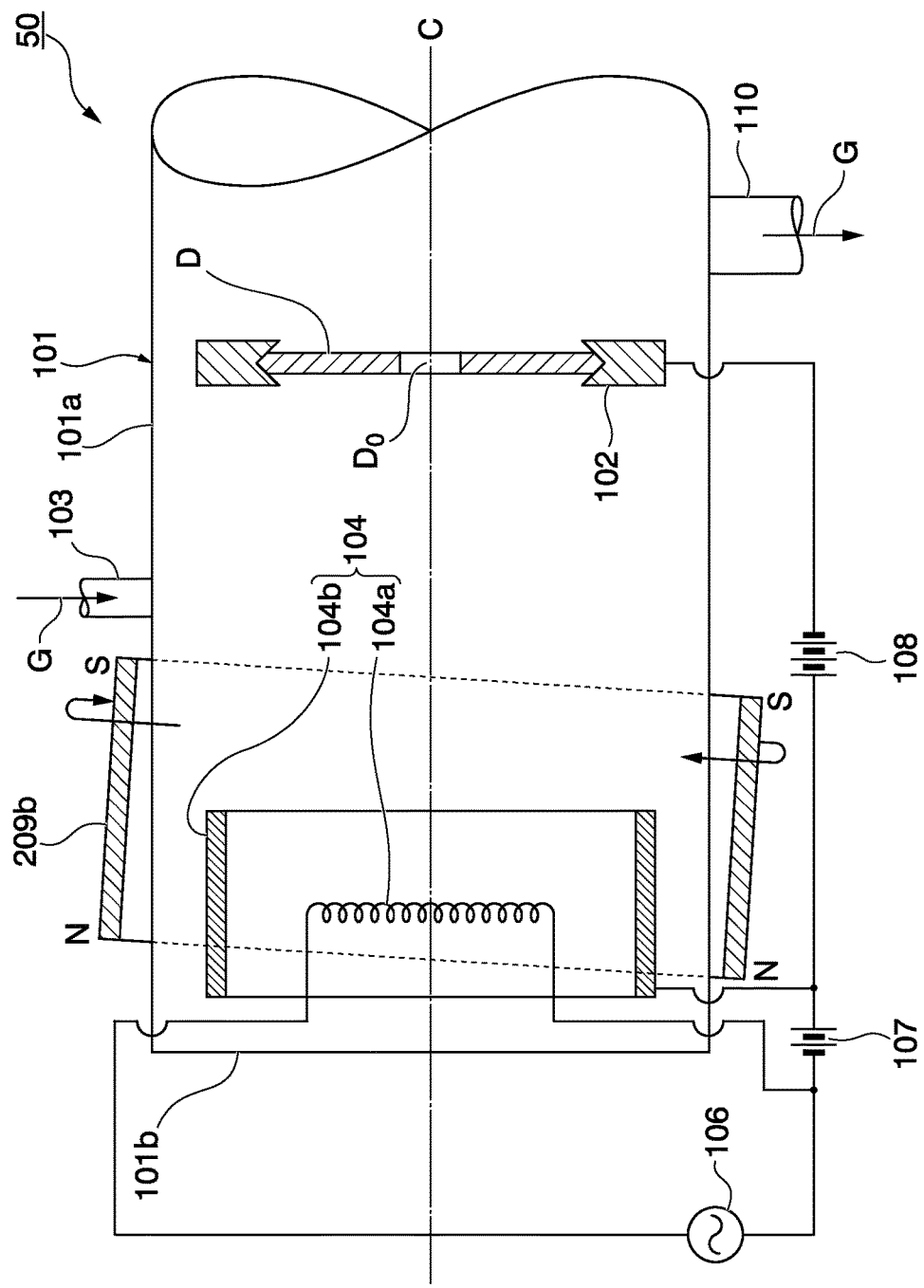
FIG. 7 is a diagram schematically showing the structure of a carbon film forming apparatus according to a fifth embodiment of the invention.

FIG. 7 is a diagram schematically showing the structure of a carbon film forming apparatus according to a fifth embodiment of the invention.

The carbon film forming apparatus according to this embodiment differs from the carbon film forming apparatus according to the fourth embodiment, in which the magnet is provided on the opposite side of the substrate across the ion source 104 on the central axis C outside the film forming chamber, in that a magnet (second magnet 209b) is provided in the outer circumference of a side wall 101a of a film forming chamber 101. In addition, the carbon film forming apparatus according to this embodiment differs from the carbon film forming apparatus according to the second embodiment, in which the magnet (second magnet 109b) is eccentric with respect to the central axis C, in that a magnet (second magnet 209b) is provided so as to be inclined with respect to the central axis C.

The term 'inclination' means that a segment connecting the N-pole and the S-pole of the second magnet 209b is not parallel to the central axis C.

A carbon film forming apparatus 50 shown in FIG. 7 is a film forming apparatus using an ion beam deposition method and has a schematic structure including a film forming chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, and the second magnet 209b that is provided in the outer circumference of the side wall 101a of the film forming chamber 101, can be rotated about the central axis C connecting the center of the ion source 104 and a position $D_0$ corresponding to the center of the substrate held by the holder 102, and is inclined with respect to the central axis C.

In the carbon film forming apparatus according to the fifth embodiment, only one type of magnet is used to adjust the application of the magnetic field to an excitation space for uniformizing the thickness distribution of a carbon film. Therefore, it is easy to adjust the magnetic field.

(Sixth Embodiment)

Figure 8:
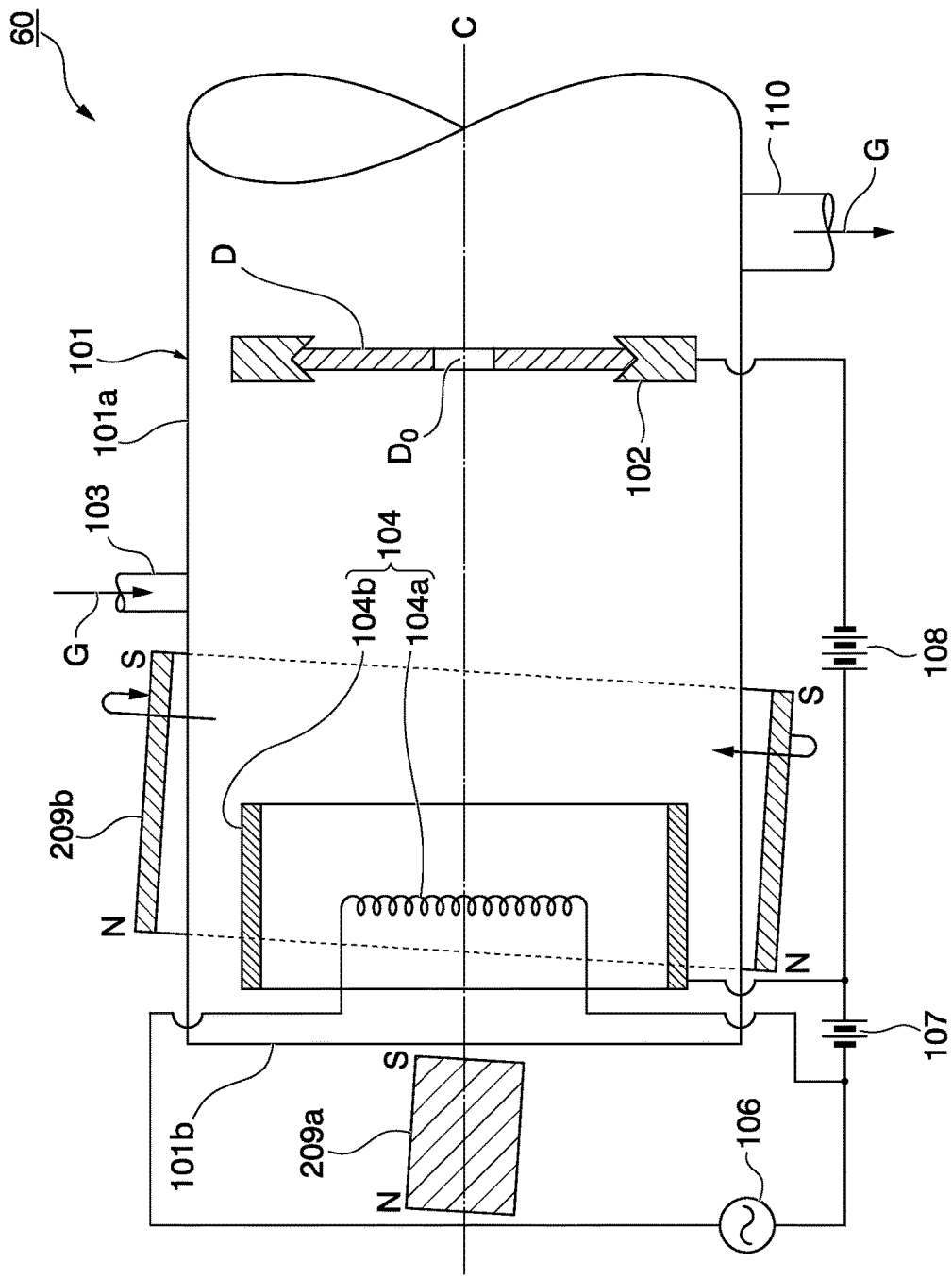
FIG. 8 is a diagram schematically showing the structure of a carbon film forming apparatus according to a sixth embodiment of the invention.

FIG. 8 is a diagram schematically showing the structure of a carbon film forming apparatus according to a sixth embodiment of the invention.

The carbon film forming apparatus according to this embodiment differs from the carbon film forming apparatuses according to the fourth and fifth embodiments in that it include both a first magnet 209a and a second magnet 209b. In addition, the carbon film forming apparatus according to this embodiment differs from the carbon film forming apparatus according to the third embodiment, in which the magnets (the first magnet 109a and the second magnet 109b) are eccentrically arranged with respect to the central axis C, in that the magnets (the first magnet 209a and the second magnet 209b) are provided so as to be inclined with respect to the central axis C.

The term 'inclination' has the same meaning as that in FIGS. 6 and 7.

A carbon film forming apparatus 60 shown in FIG. 8 is a film forming apparatus using an ion beam deposition method and has a schematic structure including a film forming chamber 101 that has a side wall and can be depressurized, a holder 102 that can hold a substrate D in the film forming chamber 101, an introduction pipe 103 that introduces a raw material gas G including carbon into the film forming chamber 101, an ion source 104 that radiates an ion beam to the substrate D held by the holder 102, the first magnet 209a that is provided on the rear side of the ion source 104 on the central axis C, which connects the center of the ion source 104 and a position $D_0$ corresponding to the center of the substrate D held by the holder 102, outside the film forming chamber 101, can be rotated about the central axis C, and is inclined with respect to the central axis C, and the second magnet 209b that is provided in the outer circumference of the side wall 101a of the film forming chamber 101, can be rotated about the central axis C, and is inclined with respect to the central axis C.

The carbon film forming apparatus includes the first magnet 209a that is provided on the backside (rear side) of the ion source 104 so as to be eccentric with respect to the central axis C and the second magnet 209b that is provided in the outer circumference of the side wall 101a of the film forming chamber 101 so as to be eccentric with respect to the central axis C. Therefore, it is possible to strengthen the magnetic field which is generated in parallel to the central axis C, as compared to a structure in which only one of the first magnet 209a and the second magnet 209b is provided. As a result, it is possible to further accelerate the uniformization of the density distribution of ion beams in the diametric direction of the substrate. When the eccentric axis of the first magnet 209a (the eccentric axis of the first magnet 209a corresponds to the central axis of the first magnet 209a) is aligned with the eccentric axis of the second magnet 209b, the maximum magnetic field is formed on the eccentric axis.

The carbon film forming apparatus according to this embodiment has the advantages over the carbon film forming apparatuses according to the fourth and fifth embodiments that it is possible to individually adjust the degree of eccentricity or magnetic force of two types of magnets, that is, the first magnet 209a and the second magnet 209b in order to uniformize the thickness distribution of the carbon film and flexibility in adjustment is improved.

[Carbon Film Forming Method]

(First Embodiment)

A carbon film forming method according to a first embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of a substrate. The carbon film forming method is characterized in that it forms the carbon film while rotating a magnet, which is provided on the rear side of a region in which the raw material gas is ionized so as to be eccentric with respect to a central axis connecting the center of the ion source and the center of the substrate, in the circumferential direction.

In the following description, reference numerals which follow components correspond to the reference numerals described in the drawings.

In the carbon film forming method according to the invention, for example, gas including a hydrocarbon can be used as the raw material gas G including carbon. One or two or more kinds of lower carbon hydrocarbons among lower saturated hydrocarbons, lower unsaturated hydrocarbons, and lower cyclic hydrocarbons are preferably used as the hydrocarbon. The term "lower" indicates a case in which a carbon number is 1 to 10.

For example, methane, ethane, propane, butane, and octane can be used as the lower saturated hydrocarbon. For example, isoprene, ethylene, propylene, butylene, and butadiene can be used as the lower unsaturated hydrocarbon. For example, benzene, toluene, xylene, styrene, naphthalene, cyclohexane, and cyclohexadiene can be used as the lower cyclic hydrocarbon.

In the invention, it is preferable to use the lower hydrocarbon for the following reason: when the carbon number in a hydrocarbon is beyond the above mentioned range, it is difficult to supply the lower hydrocarbon as gas from the introduction pipe 103, a hydrocarbon is less likely to be decomposed during discharge, and the carbon film includes a large number of polymer components having low strength.

In the invention, a mixed gas including, for example, inert gas or hydrogen gas is preferably used as the raw material gas G including carbon in order to generate plasma in the film forming chamber 101. The mixture ratio of hydrocarbon to inert gas in the mixed gas is preferably set in the range of 2:1 to 1:100 (volume ratio). When the mixture ratio is set in the above mentioned range, it is possible to form a carbon film with high hardness and durability.

In the invention, the following process is performed by the film forming apparatus using the above mentioned ion beam deposition method: the raw material gas G including carbon is introduced into the depressurized film forming chamber 101; the raw material gas G is ionized by the heating of the filament-shaped cathode electrode 104a by the supply of power and the discharge between the cathode electrode 104a and the anode electrode 104b which is provided around the cathode electrode 104a; and the ionized gas is accelerated and radiated to the surface of the substrate D. In this case, the magnetic field is applied from the outside to increase the ion density of the ionized gas which is accelerated and radiated, thereby forming a carbon film with high hardness and density on the surface of the substrate D.

In this embodiment, the magnet is provided on the rear side of the region in which the raw material gas is ionized so as to be eccentric with respect to the central axis connecting the center of the ion source and the center of the substrate to be processed and the carbon film is formed while the magnet is rotated in the circumferential direction. Therefore, the distribution of the magnetic field applied to the excitation space is uniformized and it is possible stabilize the thickness distribution of the carbon film formed on the surface of the substrate D.

(Second Embodiment)

A carbon film forming method according to a second embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of the substrate. The carbon film forming method is characterized in that it forms the carbon film while rotating a magnet, which is provided around a region in which the ionized gas is accelerated so as to be eccentric with respect to a central axis connecting the center of the ion source and the center of the substrate, in the circumferential direction.

In this embodiment, the magnet is provided around the region in which the ionized gas is accelerated so as to be eccentric with respect to the central axis connecting the center of the ion source and a position corresponding to the center of the substrate and the carbon film is formed while the magnet is rotated in the circumferential direction. Therefore, the distribution of the magnetic field applied to an excitation space is uniformized and it is possible stabilize the thickness distribution of the carbon film formed on the surface of a substrate D.

(Third Embodiment)

A carbon film forming method according to a third embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of the substrate. The carbon film forming method is characterized in that it forms the carbon film while rotating magnets, which are respectively provided on the rear side of a region in which the raw material gas is ionized and around a region in which the ionized gas is accelerated so as to be eccentric with respect to a central axis connecting the center of the ion source and the center of the substrate, in the circumferential direction.

In this embodiment, the magnets are respectively provided on the rear side of the region in which the raw material gas is ionized and around the region in which the ionized gas is accelerated so as to be eccentric with respect to the central axis connecting the center of the ion source and the center of the substrate and the carbon film is formed while the magnets are rotated in the circumferential direction. Therefore, the distribution of the magnetic field applied to an excitation space is uniformized and it is possible stabilize the thickness distribution of the carbon film formed on the surface of a substrate D.

(Fourth Embodiment)

A carbon film forming method according to a fourth embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of the substrate. The carbon film forming method is characterized in that it forms the carbon film while rotating a magnet, which is provided on the rear side of a region in which the raw material gas is ionized so as to be inclined with respect to a central axis connecting the center of the ion source and the center of the substrate, in the circumferential direction.

In the invention, the magnet is provided on the rear side of the region in which the raw material gas is ionized so as to be inclined with respect to the central axis connecting the center of the ion source and the center of the substrate and the carbon film is formed while the magnet is rotated in the circumferential direction. Therefore, the distribution of the magnetic field applied to an excitation space is uniformized and it is possible to stabilize the thickness distribution of the carbon film formed on the surface of a substrate D.

(Fifth Embodiment)

A carbon film forming method according to a fifth embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of the substrate. The carbon film forming method is characterized in that it forms the carbon film while rotating a magnet, which is provided around a region in which the ionized gas is accelerated so as to be inclined with respect to a central axis connecting the center of the ion source and the center of the substrate, in the circumferential direction.

In this embodiment, the magnet is provided around the region in which the ionized gas is accelerated so as to be inclined with respect to the central axis connecting the center of the ion source and the center of the substrate and the carbon film is formed while the magnet is rotated in the circumferential direction. Therefore, the distribution of the magnetic field applied to an excitation space is uniformized and it is possible to stabilize the thickness distribution of the carbon film formed on the surface of a substrate D.

(Sixth Embodiment)

A carbon film forming method according to a sixth embodiment of the invention introduces a raw material gas including carbon into a depressurized film forming chamber, ionizes the gas by using an ion source, accelerates the ionized gas, and radiates the ionized gas to a surface of a substrate to form a carbon film on the surface of the substrate. The carbon film forming method is characterized in that it forms the carbon film while rotating magnets, which are respectively provided on the rear side of a region in which the raw material gas is ionized and around a region in which the ionized gas is accelerated so as to be inclined with respect to a central axis connecting the center of the ion source and the center of the substrate, in the circumferential direction.

In the invention, the magnets are respectively provided on the rear side of the region in which the raw material gas is ionized and around the region in which the ionized gas is accelerated so as to be inclined with respect to the central axis connecting the center of the ion source and the center of the substrate and the carbon film is formed while the magnets are rotated in the circumferential direction. Therefore, the distribution of the magnetic field applied to an excitation space is uniformized and it is possible stabilize the thickness distribution of the carbon film formed on the surface of a substrate D.

[Magnetic Recording Medium Manufacturing Method]

Next, a magnetic recording medium manufacturing method according to the invention will be described.

In this embodiment, an example will be described in which a magnetic recording medium provided in a hard disk device is manufactured by an in-line film forming apparatus that performs a film forming process while sequentially transporting the substrate, on which a film will be formed, between a plurality of film forming chambers.

(Magnetic Recording Medium)

Figure 9:
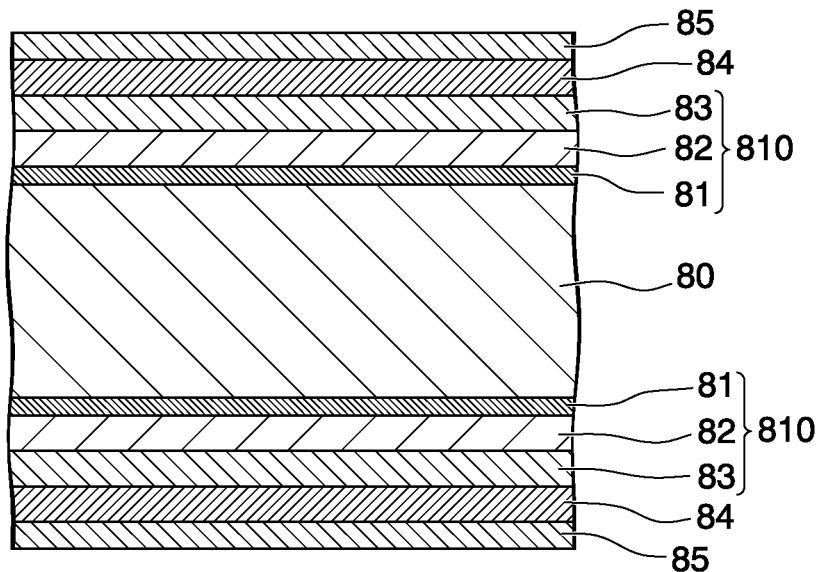
FIG. 9 is a cross-sectional view showing an example of a magnetic recording medium manufactured by a manufacturing method according to the invention.

For example, as shown in FIG. 9, the magnetic recording medium which is manufactured by the manufacturing method according to the invention has a structure in which soft magnetic layers 81, intermediate layers 82, recording magnetic layers 83, and protective layers 84 are sequentially formed on both surfaces of a non-magnetic substrate 80 and lubrication films 85 are formed on the outermost surfaces. The soft magnetic layer 81, the intermediate layer 82, and the recording magnetic layer 83 form a magnetic layer 810.

In the magnetic recording medium, as the protective layer 84, a carbon film with high hardness and density is formed with a uniform thickness by the carbon film forming method according to the invention. In this case, in the magnetic recording medium, it is possible to reduce the thickness of the carbon film. Specifically, it is possible to reduce the thickness of the carbon film to about 2 nm or less.

Therefore, in the invention, it is possible to set a distance between the magnetic recording medium and a magnetic head to a small value. As a result, it is possible to increase the recording density of the magnetic recording medium and to improve the anticorrosion performance of the magnetic recording medium.

Next, layers other than the protective layer 84 of the magnetic recording medium will be described.

Any non-magnetic substrates, such as an Al alloy substrate made of, for example, an Al—Mg alloy having Al as a main component or substrates made of general soda glass, aluminosilicate-based glass, crystallized glasses, silicon, titanium, ceramics, and various kinds of resins, can be used as the non-magnetic substrate 80.

Among them, it is preferable to use an Al alloy substrate, a substrate made of glass, such as crystallized glass, or a silicon substrate. The average surface roughness (Ra) of the substrate is preferably equal to or less than 1 nm, more preferably equal to or less than 0.5 nm, and most preferably equal to or less than 0.1 nm.

The magnetic layer 810 may be an in-plane magnetic layer for an in-plane magnetic recording medium or a vertical magnetic layer for a vertical magnetic recording medium. It is preferable to use the vertical magnetic layer in order to increase the recording density. It is preferable that the magnetic layer 810 be made of an alloy having Co as a main component. For example, a laminate of the soft magnetic layer 81 which is made of, for example, a soft-magnetic FeCo alloy (FeCoB, FeCoSiB, FeCoZr, FeCoZrB, FeCoZrBCu, or the like), a FeTa alloy (FeTaN, FeTaC, or the like), or a Co alloy (CoTaZr, CoZrNB, CoB, or the like), the intermediate layer 82 which is made of, for example, Ru, and the recording magnetic layer 83 which is made of a 60Co-15Cr-15Pt alloy or a 70Co-5Cr-15Pt-10SiO$_2$ alloy can be used as the magnetic layer 810 for a vertical magnetic recording medium. An orientation control film which is made of, for example, Pt, Pd, NiCr, or NiFeCr may be provided between the soft magnetic layer 81 and the intermediate layer 82. A laminate of a non-magnetic CrMo base layer (underlayer) and a CoCrPtTa ferromagnetic layer can be used as the magnetic layer 810 for an in-plane magnetic recording medium.

The overall thickness of the magnetic layer 810 is equal to or greater than 3 nm and equal to or less than 20 nm and preferably equal to or greater than 5 nm and equal to or less than 15 nm. The magnetic layer 810 may be formed such that sufficient head output and input are obtained, depending on the magnetic alloy and stacking structure used. The magnetic layer 810 needs to have a thickness equal to or greater than a predetermined value in order to obtain an output equal to or greater than a predetermined value during reproduction. In general, parameters indicating recording and reproduction characteristics deteriorate with an increase in output. Therefore, it is necessary to set the thickness of the magnetic layer 810 to an optimum value.

A fluorinated liquid lubricant which is made of, for example, perfluoropolyether (PFPE) or a solid lubricant which is made of, for example, a patty acid can be used as a lubricant for the lubrication layer 85. In general, the lubrication layer 85 is formed with a thickness of 1 nm to 4 nm. A known method, such as a dipping method or a spin coating method, may be used as a method for applying the lubricant.

Figure 10:
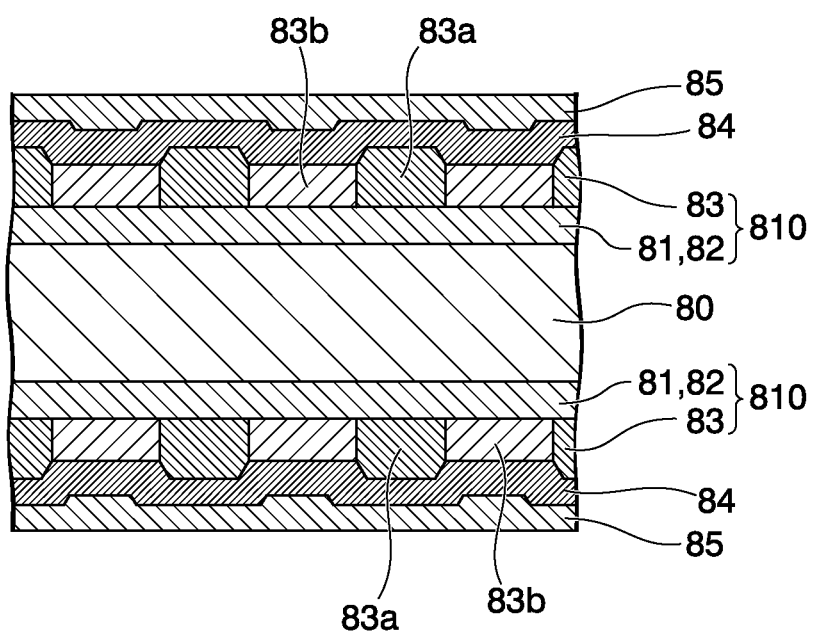
FIG. 10 is a cross-sectional view showing another example of the magnetic recording medium manufactured by the manufacturing method according to the invention.

As another magnetic recording medium which is manufactured by the manufacturing method according to the invention, for example, a so-called discrete magnetic recording medium may be used in which magnetic recording patterns 83a formed in the recording magnetic layer 83 are separated from each other by non-magnetic regions 83b, as shown in FIG. 10.

Examples of the discrete magnetic recording medium include so-called patterned media in which the magnetic recording patterns 83a are regularly arranged for one bit, media in which the magnetic recording patterns 83a are arranged in a track shape, and other media in which the magnetic recording pattern 83a includes, for example, a servo signal pattern.

The discrete magnetic recording medium is obtained by providing a mask layer on the surface of the recording magnetic layer 83 and by performing a reactive plasma process or an ion irradiation process on a portion of the recording magnetic layer 83 that is not covered with the mask layer to modify the portion of the recording magnetic layer 83 from a magnetic body to a non-magnetic body, thereby forming the non-magnetic region 83b.

(Magnetic Recording and Reproducing Device)

Figure 11:
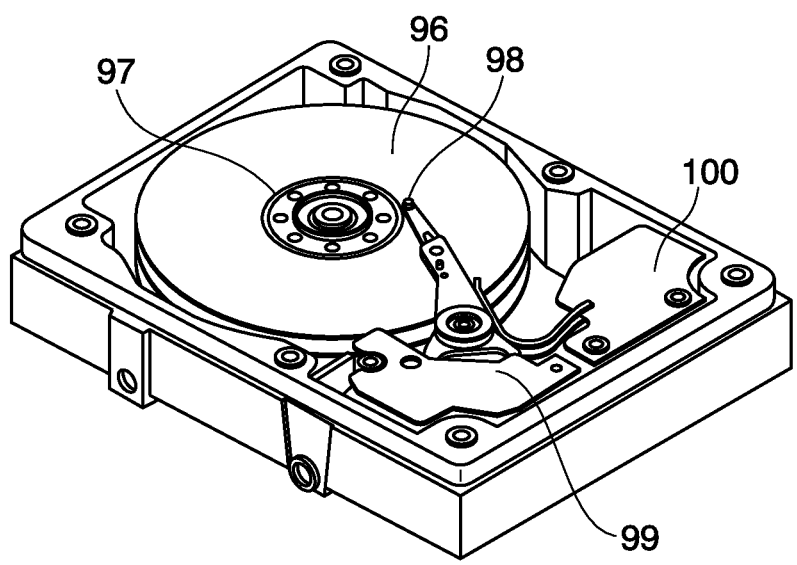
FIG. 11 is a cross-sectional view showing an example of the internal structure of a magnetic recording and reproducing device.

For example, a hard disk device shown in FIG. 11 can be given as an example of a magnetic recording and reproducing device using the above mentioned magnetic recording medium. The hard disk device includes a magnetic disk 96 which is the above mentioned magnetic recording medium, a medium driving unit 97 which rotates the magnetic disk 96, a magnetic head 98 which records information on the magnetic disk 96 and reproduces information from the magnetic disk 96, a head driving unit 99, and a recording and reproducing signal processing system 100. The magnetic reproducing signal processing system 100 processes input data, transmits a recording signal to the magnetic head 98, processes a reproducing signal from the magnetic head 98, and outputs data.

(In-Line Film Forming Apparatus)

Figure 12:
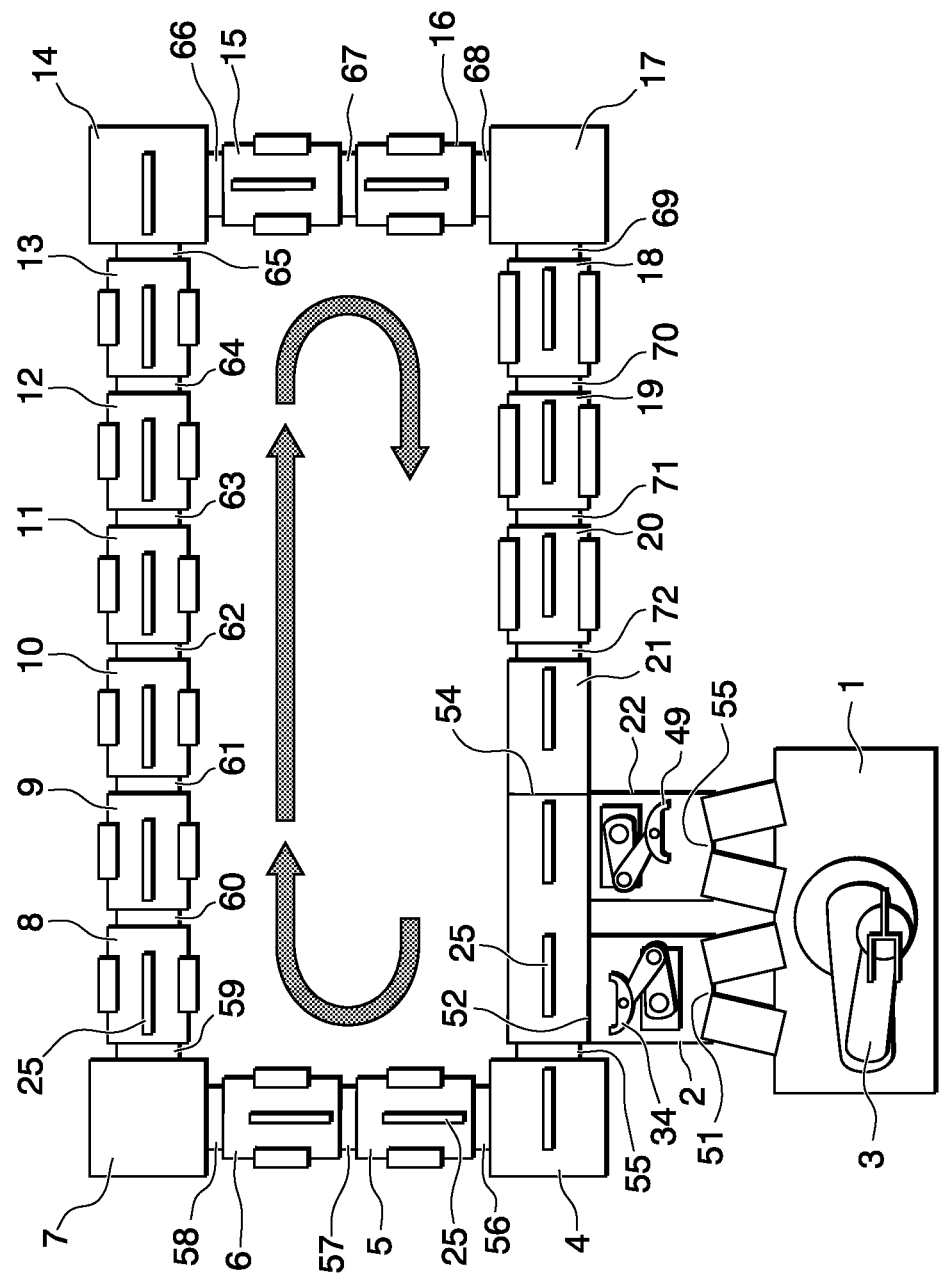
FIG. 12 is a plan view showing the structure of an in-line film forming apparatus according to the invention.

For example, when the above mentioned magnetic recording medium is manufactured, the in-line film forming apparatus (magnetic recording medium manufacturing apparatus) according to the invention shown in FIG. 12 is used to sequentially form the magnetic layers 810, each including at least the soft magnetic layer 81, the intermediate layer 82, and the recording magnetic layer 83, and the protective layers 84 on both surfaces of the non-magnetic substrate 80, on which films will be formed. Therefore, it is possible to stably manufacture the magnetic recording medium having a carbon film with high hardness and density as the protective layer 84.

Specifically, the in-line film forming apparatus according to the invention has a schematic structure including a robot stand 1, a substrate cassette transfer robot 3 which is placed on the robot stand 1, a substrate supply robot chamber 2 which is adjacent to the robot stand 1, a substrate supply robot 34 which is installed in the substrate supply robot chamber 2, a substrate attachment chamber 52 which is adjacent to the substrate supply robot chamber 2, corner chambers 4, 7, 14, and 17 which rotate a carrier 25, processing chambers 5, 6, 8 to 13, 15, 16, and 18 to 21 which are provided between the corner chambers 4, 7, 14, and 17, a substrate detachment chamber 54 which is provided adjacent to the processing chamber 21, a substrate detachment robot chamber 22 which is provided adjacent to the substrate detachment chamber 54, a substrate detachment robot 49 which is installed in the substrate detachment robot chamber 22, and a plurality of carriers 25 which are transported between the chambers.

Each of the chambers 2, 52, 4 to 21, and 54 is connected to two adjacent walls and gate valves 55 to 72 are provided in connection portions between the chambers 2, 52, 4 to 21, and 54. When the gate valves 55 to 72 are closed, the inside of each chamber is an independent closed space.

Vacuum pumps (not shown) are connected to the chambers 2, 52, 4 to 21, and 54 and the inside of each chamber can be depressurized by the operation of the vacuum pump. The soft magnetic layer 81, the intermediate layer 82, the recording magnetic layer 83, and the protective layer 84 are sequentially formed on both surfaces of the non-magnetic substrate 80 mounted on the carrier 25 in the depressurized chambers while the carrier 25 is sequentially transported between the chambers by a transport mechanism (not shown). In this way, the in-line film forming apparatus according to the invention is configured such that the magnetic recording medium shown in FIG. 9 is finally obtained. The corner chambers 4, 7, 14, and 17 are chambers for changing the moving direction of the carrier 25. A mechanism which rotates the carrier 25 and moves the carrier 25 to the next chamber is provided in each of the corner chambers 4, 7, 14, and 17.

The substrate cassette transfer robot 3 is configured to supply the non-magnetic substrate 80 from a cassette that stores the non-magnetic substrates 80 before deposition to the substrate attachment chamber 2 and to take out the non-magnetic substrate 80 (magnetic recording medium) after deposition which is detached in the substrate detachment chamber 22. Openings which are exposed to the outside and doors 51 and 55 which open or close the openings are provided in one side wall of each of the substrate attachment chamber 2 and the substrate detachment chamber 22.

In the substrate attachment chamber 52, the non-magnetic substrate 80 before deposition is mounted on the carrier 25 by the substrate supply robot 34. In the substrate detachment chamber 54, the non-magnetic substrate 80 (magnetic recording medium) after deposition which is mounted on the carrier 25 is detached by the substrate detachment robot 49.

A plurality of film forming chambers for forming the magnetic layer 810 are formed by the processing chambers 5, 6, 8 to 13, 15, and 16 among the processing chambers 5, 6, 8 to 13, 15, 16, and 18 to 21. The film forming chambers include a mechanism for forming the soft magnetic layer 81, the intermediate layer 82, and the recording magnetic layer 83 on both surfaces of the non-magnetic substrate 80.

The processing chambers 18 to 20 form a film forming chamber for forming the protective layer 84. The film forming chamber has the same apparatus structure as the film forming apparatus using the ion beam deposition method shown in FIG. 1 and forms a carbon film with high hardness and density as the protective layer 84 on the surface of the non-magnetic substrate 80 having the magnetic layer 810 formed thereon.

When the magnetic recording medium shown in FIG. 10 is manufactured, the processing chambers may further include a patterning chamber for patterning a mask layer on the recording magnetic layer 83, a modifying chamber for performing a reactive plasma process or an ion irradiation process on a portion of the recording magnetic layer 83 which is not covered with the patterned mask layer to modify the portion of the recording magnetic layer 83 from a magnetic body to a non-magnetic body, thereby forming the magnetic recording patterns 83a separated by the non-magnetic regions 83b, and a removal chamber for removing the mask layer.

A processing gas supply pipe is provided in each of the processing chambers 5, 6, 8 to 13, 15, 16, and 18 to 21. A valve which is opened and closed under the control of a control mechanism (not shown) is provided in the supply pipe. The valves and the pump gate valves are opened and closed to control the supply of gas from the processing gas supply pipe, the internal pressure of the chamber, and the discharge of gas.

Figure 13:
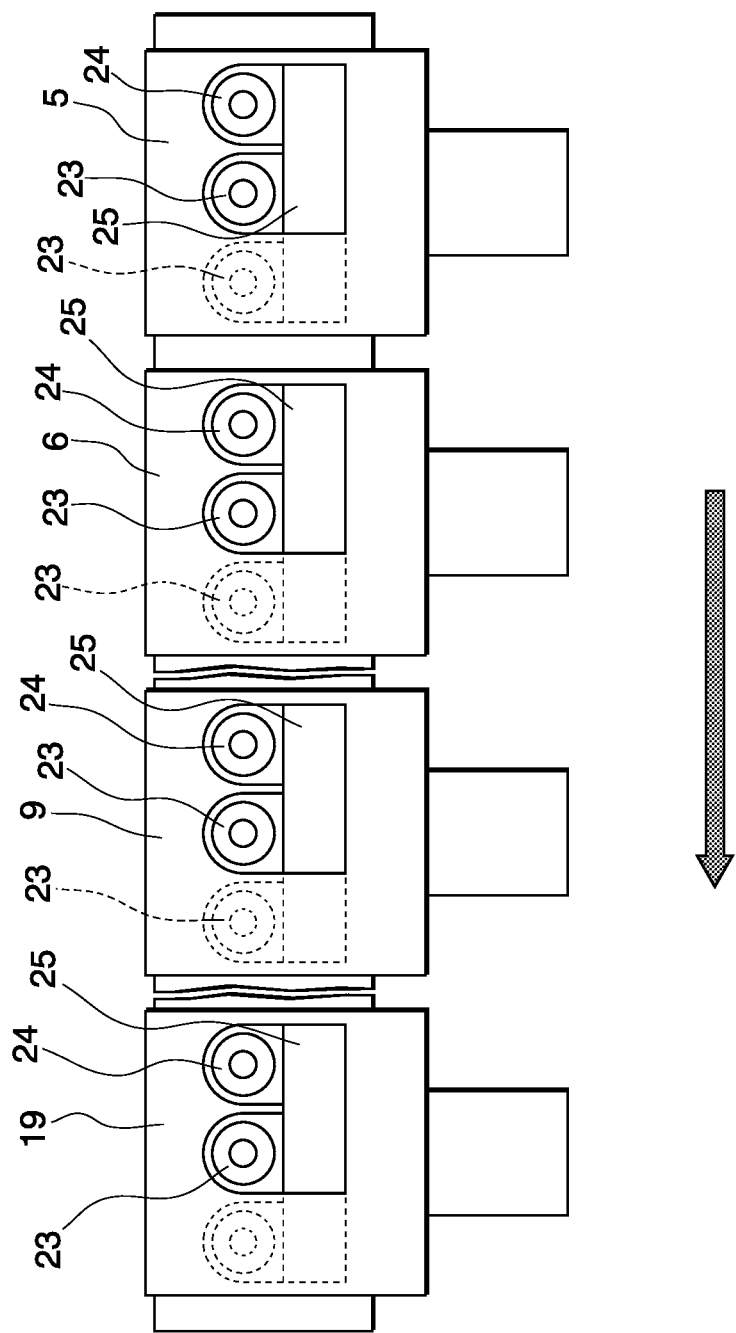
FIG. 13 is a side view showing a carrier of the in-line film forming apparatus according to the invention.
Figure 14:
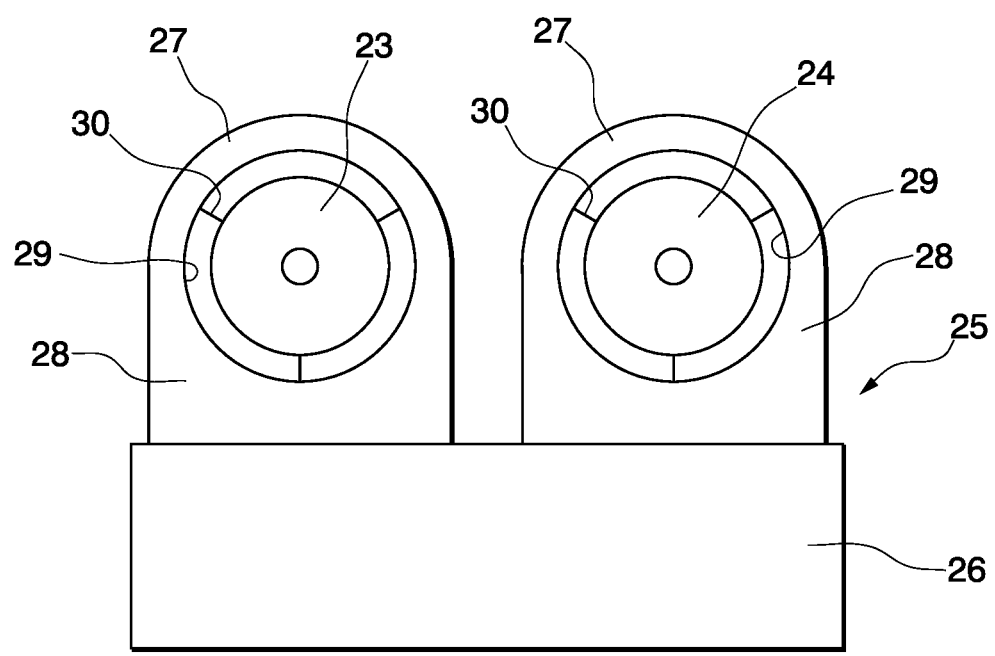
FIG. 14 is an enlarged side view showing the carrier shown in FIG. 13.

As shown in FIGS. 13 and 14, the carrier 25 includes a support 26 and a plurality of substrate mounting portions 27 which are provided on the upper surface of the support 26. In this embodiment, the support 26 is configured such that two substrate mounting portions 27 can be mounted on the support 26. Therefore, two non-magnetic substrates 80 which are mounted on the substrate mounting portions 27 are referred to as a first film forming substrate 23 and a second film forming substrate 24.

The substrate mounting portion 27 has a thickness that is about equal to or several times greater than the thickness of the first and second film forming substrates 23 and 24 and includes a plate body 28 in which a through hole 29 is formed in a thickness direction and a plurality of supporting members 30 which protrude inward from the circumferential edge of the through hole 29 in the thickness direction in a plan view. The through hole 29 has a circular shape and a diameter that is slightly greater than that of the film forming substrates 23 and 24. In the substrate mounting portions 27, the first and second film forming substrates 23 and 24 are inserted into the through holes 29 and the circumference thereof is fitted to the supporting members 30. Therefore, the first and second film forming substrates 23 and 24 are vertically held (the main surfaces of the substrates 23 and 24 are parallel to the direction of gravity). That is, in the substrate mounting portion 27, the mounted first and second film forming substrates 23 and 24 are provided on the upper surface of the support 26 in parallel such that the main surfaces thereof are substantially orthogonal to the upper surface of the support 26 and are substantially flush with each other.

In the processing chambers 5, 6, 8 to 13, 15, 16, and 18 to 21, two processing devices are provided on both sides of the carrier 25. In this case, for example, with the carrier 25 stopped at a first processing position represented by a solid line in FIG. 13, for example, a deposition process can be performed on the first film forming substrate 23 which is provided on the left side in the carrier 25. Then, the carrier 25 can be moved to a second processing position represented by a dashed line in FIG. 13. With the carrier 25 stopped at the second processing position, for example, a deposition process can be performed on the second film forming substrate 24 which is provided on the right side in the carrier 25.

When four processing devices are provided on both sides of the carrier 25 so as to face the first and second film forming substrates 23 and 24, it is not necessary to move the carrier 25 and, for example, a deposition process can be performed on the first and second film forming substrates 23 and 24 held by the carrier 25 at the same time.

After deposition, the first film forming substrate 23 and the second film forming substrate 24 are detached from the carrier 25.

EXAMPLES

Hereinafter, the effects of the invention will become apparent from the following examples. The invention is not limited to the following examples and can be appropriately changed, without departing from the scope and spirit of the invention.

Example 1

In Example 1, a base body (base substrate) including a carbon film (protective film) in a magnetic recording medium was manufactured by the carbon film forming apparatus according to the first embodiment of the invention, the carbon film forming method according to the first embodiment of the invention, and the magnetic recording medium manufacturing method according to the invention.

First, a NiP-plated aluminum substrate was prepared as a non-magnetic substrate. Then, the in-line film forming apparatus shown in FIG. 12 was used to sequentially form a soft magnetic layer which was made of FeCoB and had a thickness of 60 nm, an intermediate layer which was made of Ru and had a thickness of 10 nm, and a recording magnetic layer which was made of a 70Co-5Cr-15Pt-10SiO$_2$ alloy and had a thickness of 15 nm on both surfaces of the non-magnetic substrate mounted on a carrier which was made of an A5052 aluminum alloy. Then, the non-magnetic substrate mounted on the carrier was transported to a processing chamber having the same structure as the film forming apparatus shown in FIG. 1 and protective layers, which were carbon films, were formed on both surfaces of the non-magnetic substrate having the magnetic layers formed thereon.

Specifically, the processing chamber has a cylindrical shape with an outside diameter of 180 mm and a length of 250 mm and the wall of the processing chamber is made of SUS304. A coil-shaped cathode electrode which is made of tantalum and has a length of about 30 mm and a cylindrical anode electrode which surrounds the cathode electrode are provided in the processing chamber. The anode electrode is made of SUS304 and has an outside diameter of 140 mm and a length of 40 mm. The distance between the cathode electrode and the non-magnetic substrate was 160 mm. In addition, outside the chamber, a first magnet was arranged at a position that was 40 mm away from the rear side of the coil-shaped cathode electrode which was made of tantalum. A NdFe-based sintered bar magnet which had a diameter of 30 mm and a length of 40 mm was used as the first magnet. The NdFe-based sintered bar magnets had a residual magnetic flux density of 1.3 T. The first magnet was arranged such that the central axis (eccentric axis) deviated from a central axis which connects the center of the ion source and the center of the substrate by 5 mm. While the carbon film was being formed, the first magnet was rotated at 1000 rpm.

Toluene gas was used as a raw material gas. The carbon film was formed under the following conditions: a gas flow rate of 2.9 SCCM; a reaction pressure of 0.2 Pa; a cathode power of 225 W (AC 22.5 V, 10 A); a voltage between the cathode electrode and the anode electrode was 75 V; a current between the cathode electrode and the anode electrode was 1650 mA; an ion acceleration voltage of 200 V; an ion acceleration current of 180 mA; a deposition time of 1.5 seconds; and the thickness of the formed carbon film was 1.9 nm.

Example 2

In Example 2, a base body including a carbon film (protective film) in a magnetic recording medium was manufactured by the carbon film forming apparatus according to the fourth embodiment of the invention, the carbon film forming method according to the fourth embodiment of the invention, and the magnetic recording medium manufacturing method according to the invention.

In Example 2, a base body was manufactured by the carbon film forming apparatus shown in FIG. 6 under the same conditions as those in Example 1 except that a first magnet was arranged so as to be inclined at an angle of 7° with respect to a central axis connecting the center of the ion source and a position corresponding to the center of the substrate.

Example 3

In Example 3, a second magnet was provided in addition to the structure according to Example 2.

The second magnet was formed by arranging 20 NdFe-based sintered bar magnets, which had a size of 10 mm square and a length of 40 mm, in parallel at equal intervals so as to have a cylindrical shape with an inside diameter of 200 mm and a length of 40 mm. The NdFe-based sintered bar magnet had a residual magnetic flux density of 1.3 T. The second magnet was arranged around the wall of a chamber such that the S-pole of each sintered bar magnet was close to the substrate, the N-pole thereof was close to the cathode electrode, and the central axis (eccentric axis) of the second magnet deviated from a central axis connecting the center of the ion source and the center of the substrate by 10 mm. While the carbon film was being formed, the second magnet was rotated at 100 rpm.

Comparative Example 1

In Comparative Example 1, a base body was manufactured by a carbon film forming apparatus in which the same magnet as the first magnet used in Example 1 was not eccentric and the central axis of the magnet was aligned with a central axis connecting the center of an ion source and a position corresponding to the center of a substrate, without rotating the magnet.

The other conditions were the same as those in Example 1.

Comparative Example 2

In Comparative Example 2, a base body was manufactured by a carbon film forming apparatus without a magnet corresponding to the first magnet used in Example 1.

The other conditions were the same as those in Example 1.

Comparative Example 3

In Comparative Example 3, a base body was manufactured by a carbon film forming apparatus in which the same magnet as the first magnet used in Example 1 was not eccentric and the central axis of the magnet was aligned with a central axis connecting the center of an ion source and the center of a substrate, while rotating the magnet at 1000 rpm during the manufacture of a carbon film.

The other conditions were the same as those in Example 1.

(Evaluation of Thickness Distribution of Carbon Film)

Figure 15A:
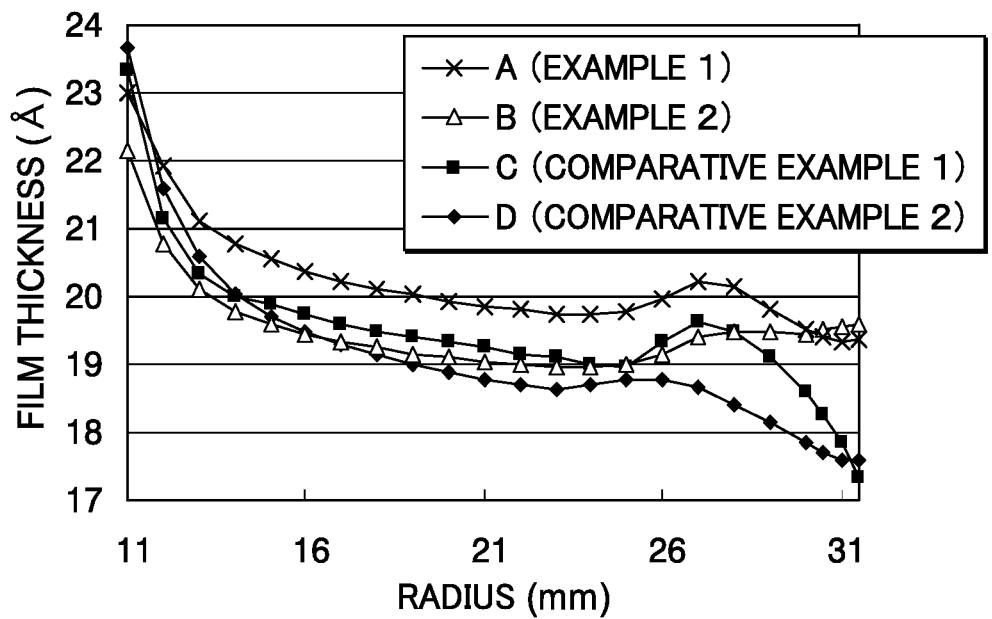
FIG. 15A is a graph showing the thickness distribution of a carbon film in a radius direction for base bodies according to Example 1 and 2 and Comparative Examples 1 and 2.
Figure 15B:
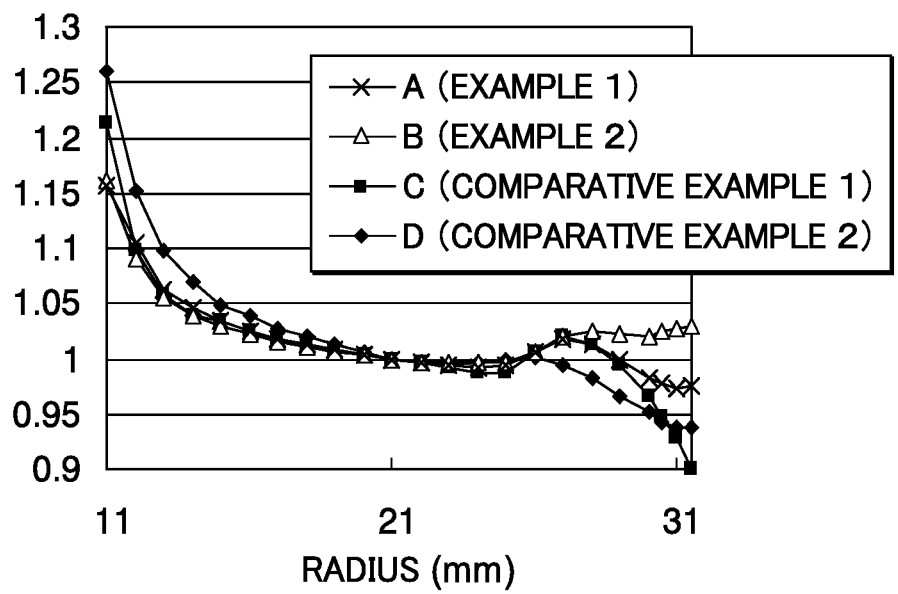
FIG. 15B is a graph obtained by normalizing the results of FIG. 15A with the film thickness at a radius position of 21 mm.

FIG. 15A is a graph showing the thickness distribution of the formed carbon film in a radius direction of the surface of the carbon film for the base bodies according to Examples 1 and 2 and Comparative Examples 1 and 2. The horizontal axis indicates the distance (hereinafter, referred to as a "radius position") from the center of the surface of the base body in the radius direction. A radius position of 11 mm indicates an inner circumferential position and a radius position of 31 mm indicates an outer circumferential position. The vertical axis indicates the film thickness at each radius position. FIG. 15B is a graph showing the normalization result of the film thickness with the film thickness at the radius position of 21 mm. The horizontal axis indicates the radius position and the vertical axis indicates the film thickness at each radius position to the film thickness at the radius position of 21 mm.

In FIGS. 15A and 15B, A, B, C, and D correspond to the base bodies according to Examples 1 and 2 and Comparative Examples 1 and 2, respectively.

As shown in FIGS. 15A and 15B, in Example 1, a variation in the film thickness at a radius position of 13 mm to 31 mm was only about 1.5 Å and a uniform thickness was obtained in the wide range of the region on the surface (major surface) of the base body. In Example 2, a variation in the film thickness at a radius position of 13 mm to 31 mm was only about 1 Å and a more uniform thickness than that in Example 1 was obtained in the wide range of the region on the surface of the base body.

In contrast, in Comparative Examples 1 and 2, a variation in the film thickness at a radius position of 13 mm to 31 mm was about 3 Å that was two times more than that in Example 1 and was three times more than that in Example 2. In Comparative Example 1, the film thickness was large at a radius position of 27 mm and a variation in the film thickness was about 1.5 Å at a limited radius position of 13 mm to 28 mm. In Comparative Example 2, the film thickness was substantially monotonically reduced toward the outer circumference and a variation in the film thickness was about 2.0 Å at a limited radius position of 13 mm to 26 mm.

As described above, in Examples 1 and 2, a variation in the thickness distribution was significantly reduced in the vicinity of the outer circumference, as compared to Comparative Examples 1 and 2.

As shown in FIGS. 15A and 15B, in Examples 1 and 2, a variation in the thickness distribution in the vicinity of the inner circumference was reduced, as compared to Comparative Examples 1 and 2. In this case, the degree of the reduction in the variation in the vicinity of the inner circumference was less than that in the vicinity of the outer circumference.

Although not shown in FIGS. 15A and 15B, in Example 3, a variation in the thickness at a radius position of 13 mm to 31 mm was further reduced by 5%, as compared to Example 2.

There was no difference between a variation in the thickness at a radius position of 13 mm to 31 mm in Comparative Example 3 and a variation in the thickness at a radius position of 13 mm to 31 mm in Comparative Example 1.

According to the invention, it is possible to provide a carbon film forming apparatus, a carbon film forming method, and a magnetic recording medium manufacturing method which can improve the uniformity of the thickness of a carbon film with high hardness and density.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES 10, 20, 30, 40, 50, 60 CARBON FILM FORMING APPARATUS
101 FILM FORMING CHAMBER (DEPOSITION CHAMBER)
102 HOLDER
103 INTRODUCTION PIPE
104 ION SOURCE
109a, 209a FIRST MAGNET
109b, 209b SECOND MAGNET

What is claimed is:

1. A carbon film forming method that introduces a raw material gas including carbon into a film forming chamber, ionizes the gas by using an ion source, accelerates the ionized gas, and radiates the ionized gas to a surface of a substrate to form a carbon film on the surface of the substrate, comprising:
   forming the carbon film while rotating a first magnet, which is provided on the opposite side of the substrate across a region in which the raw material gas is ionized so as to be eccentric and/or inclined with respect to a central axis connecting the center of the ion source and a position corresponding to the center of the substrate held by a holder, in a circumferential direction.

2. A magnetic recording medium manufacturing method comprising:
   using the carbon film forming method according to claim 1.

3. The carbon film forming method according to claim 1, wherein the first magnet is disposed along the central axis.

4. The carbon film forming method according to claim 1, wherein the first magnet is arranged only on the backside of the ion source.

5. The carbon film forming method according to claim 1, wherein a second magnet, which is provided around a region in which the ionized gas is accelerated so as to be eccentric and/or inclined with respect to a central axis connecting the center of the ion source and a position corresponding to the center of the substrate held by the holder, is rotating while forming the carbon film.

6. A magnetic recording medium manufacturing method comprising:
   using the carbon film forming method according to claim 5.

* * * * *